United States Patent [19]
Yamamoto

[11] Patent Number: 5,847,440
[45] Date of Patent: Dec. 8, 1998

[54] BIPOLAR TRANSISTOR, SEMICONDUCTOR DEVICE HAVING BIPOLAR TRANSISTORS

[75] Inventor: Fumitoshi Yamamoto, Hyogo, Japan

[73] Assignee: Mitsubishi Denki Kabushiki Kaisha, Tokyo, Japan

[21] Appl. No.: 520,187

[22] Filed: Aug. 28, 1995

[30] Foreign Application Priority Data

Oct. 13, 1994 [JP] Japan ................................ 6-247533

[51] Int. Cl.⁶ .................................................. H01L 29/00
[52] U.S. Cl. ..................... 257/525; 257/552; 257/555; 257/592
[58] Field of Search ........................... 257/525, 552, 257/555, 591, 592

[56] References Cited

U.S. PATENT DOCUMENTS

| | | | |
|---|---|---|---|
| 4,637,125 | 1/1987 | Iwasaki et al. | |
| 5,179,036 | 1/1993 | Matsumoto | 437/59 |
| 5,184,203 | 2/1993 | Taguchi | 257/370 |
| 5,302,534 | 4/1994 | Monk et al. | 437/31 |
| 5,319,234 | 6/1994 | Uga et al. | 257/369 |
| 5,331,198 | 7/1994 | Kanda et al. | 257/555 |

FOREIGN PATENT DOCUMENTS

| | | |
|---|---|---|
| 60-72255 | 4/1985 | Japan . |
| 64-81334 | 3/1989 | Japan . |
| 2-264436 | 10/1990 | Japan . |
| 4-245674 | 9/1992 | Japan . |
| 5-75035 | 3/1993 | Japan . |
| 6-5793 | 1/1994 | Japan . |

*Primary Examiner*—Mahshid D. Saadat
*Assistant Examiner*—Allan R. Wilson
*Attorney, Agent, or Firm*—McDermott, Will & Emery

[57] ABSTRACT

An n-type epitaxial layer is formed on a main surface of a p-type silicon substrate. An n-type buried diffusion layer is formed extending in both the p-type silicon substrate and the n-type epitaxial layer. An n-type diffusion layer is formed in the surface of the n-type epitaxial layer, which is disposed above the n-type buried diffusion layer. A p-type diffusion layer is formed so as to surround side ends of the n-type diffusion layer. A p-type buried diffusion layer is formed so as to have a bottom face within the n-type buried diffusion layer and have side ends thereof inside side ends of the p-type diffusion layer. A collector region of a vertical pnp bipolar transistor consists of the p-type buried diffusion layer and the p-type diffusion layer. A p-type diffusion layer, which serves as an emitter region of the pnp bipolar transistor, is formed in the surface of the n-type diffusion layer. Thus, a semiconductor device having a vertical pnp bipolar transistor can be obtained which is capable of reducing its manufacturing cost and improving its reliability.

13 Claims, 44 Drawing Sheets

BIPOLAR TRANSISTOR, SEMICONDUCTOR DEVICE HAVING BIPOLAR TRANSISTORS

BACKGROUND OF THE INVENTION

1. Field of the Invention

The present invention relates to a bipolar transistor, a semiconductor device having bipolar transistors and a method of manufacturing the same, and particularly to a vertical pnp bipolar transistor, a semiconductor device having a vertical pnp bipolar transistor and a method of manufacturing the same.

2. Description of the Related Art

FIG. 37 is a cross-sectional view showing a conventional semiconductor device having a vertical pnp bipolar transistor. The structure of the conventional semiconductor device having the vertical pnp bipolar transistor will first be described with reference to FIG. 37.

As shown in FIG. 37, n-type buried diffusion layers 2 and 2a are formed in a main surface of a p-type silicon substrate 1 with an interval defined therebetween. Further, p-type diffusion layers 3 for element isolation are formed so as to interpose each of the n-type buried diffusion layers 2 and 2a therebetween. An n-type epitaxial layer 4 is formed on the main surface of the p-type silicon substrate 1. A p-type buried diffusion layer 3a is provided at a portion within the n-type epitaxial layer 4, which is located above the n-type buried diffusion layer 2a. An n-type diffusion layer 5 is formed on the p-type buried diffusion layer 3a. A p-type diffusion layer 8b is formed in the surface of the n-type diffusion layer 5.

P-type diffusion layers 6 are formed within the n-type epitaxial layer 4 located on the p-type diffusion layers 3 and the p-type buried diffusion layer 3a. A vertical pnp bipolar transistor 18 is composed of the p-type diffusion layer 8b, the n-type diffusion layer 5, the p-type diffusion layer 6 and the p-type buried diffusion layer 3a.

On the other hand, a p-type diffusion layer 8a is formed at the surface of the n-type epitaxial layer 4 disposed on the n-type buried diffusion layer 2. An n-type diffusion layer 9a is provided at the surface of the p-type diffusion layer 8a. An npn bipolar transistor 19 is composed of the n-type diffusion layer 9a, the p-type diffusion layer 8a, the n-type epitaxial layer 4 and the n-type buried diffusion layer 2.

An isolation oxide film 7 is formed on the surface of the n-type epitaxial layer 4. Openings are provided at predetermined positions of the isolation oxide film 7. Polycrystalline silicon layers 10a, 10b, 10c and 10d with n-type impurity being doped are formed within predetermined openings of isolation oxide film 7. The n-type diffusion layers 9a, 9b, 9c and 9d are provided at contact portions between the polycrystalline silicon layers 10a through 10d and the n-type epitaxial layer 4.

An interlayer insulating layer 12 composed of a silicon oxide film or the like is formed so as to cover the isolation oxide film 7 and the polycrystalline silicon layers 10a through 10d. Contact holes 12a, 12b, 12c, 12d, 12e, 12f and 12g, which reach the polycrystalline silicon layers 10a through 10d or the surface of the n-type epitaxial layer 4, are defined in the interlayer insulating layer 12. Interconnection layers 13a, 13b, 13c, 13d, 13e, 13f and 13g each composed of AlSi or the like are formed within contact holes 12a through 12g. p-type diffusion layers 11a, 11b and 11c are provided at contact portions between the interconnection layers 13b, 13e and 13g and the n-type epitaxial layer 4.

A method of manufacturing the conventional semiconductor device shown in FIG. 37 having the vertical pnp bipolar transistor will now be described with reference to FIGS. 38 through 43. FIGS. 38 through 43 are respectively cross-sectional views showing first through sixth steps of a process for fabricating the conventional semiconductor device of FIG. 37 having the vertical pnp bipolar transistor.

Referring to FIG. 38, a silicon oxide film 14a ranging in thickness from about 5000 Å to 1000 Å is formed on a main surface of a p-type silicon substrate 1. An opening is defined in the silicon oxide film 14a by photolithographic technology so as to selectively expose the main surface of the p-type silicon substrate 1. Further, an n-type impurity such as antimony (Sb) or the like is deposited within the opening and the exposed main surface is heat-treated at a temperature of about 1100° C. As a result, an n-type impurity diffusion layer 2 is formed.

Referring next to FIG. 39, a silicon oxide film 14b is formed on a main surface of a p-type silicon substrate 1 again after the silicon oxide film 14a has been removed. Further, an opening is provided at a predetermined position of the silicon oxide film 14b by photolithographic technology so as to selectively expose the main surface of the p-type silicon substrate 1. After the exposed main surface of the p-type silicon substrate 1 has been lightly oxidized, an n-type impurity such as phosphorus (P) is implanted into the main surface of the p-type silicon substrate 1 at about $1.0 \times 10^{14}$ to $2.0 \times 10^{14}/cm^2$. The exposed main surface is heat-treated at a temperature of about 1050° C. As a result, an n-type diffusion layer 2a is formed. Thereafter, the silicon oxide film 14b is removed.

Next, a silicon oxide film (not shown) ranging in thickness from about 1000 Å to 2000 Å is formed on the main surface of the p-type silicon substrate 1 again. Further, an opening is provided at a predetermined position of the silicon oxide film so as to selectively expose the main surface of the p-type silicon substrate 1. The silicon oxide film is used as a mask and a p-type impurity such as boron (B) is implanted into the main surface of the p-type silicon substrate 1 at $3.0 \times 10^{14}$ to $5.0 \times 10^{14}/cm^2$. Thereafter, the main surface thereof impregnated with the p-type impurity is heat-treated at a temperature of about 1000° C. As a result, p-type diffusion layers 3 and 3a are formed on the main surface of the p-type silicon substrate 1. An n-type epitaxial layer 4 is formed on the main surface of the p-type silicon substrate 1 by epitaxial growth process. The n-type epitaxial layer 4 preferably has a thickness of 3.0 μm or more. Thus, the n-type buried diffusion layers 2 and 2a, the p-type diffusion layers 3 and the p-type buried diffusion layer 3a are respectively formed as shown in FIG. 40.

Referring next to FIG. 41, a thin silicon oxide film (not shown) ranging in thickness from about 500 Å to 1500 Å is formed on the surface of the n-type epitaxial layer 4. Openings are defined in predetermined portions of the thin silicon oxide film by photolithographic technology. The silicon oxide film is used as a mask and an n-type impurity such as phosphorus (P) is implanted into each opening at about $5 \times 10^{12}$ to $5 \times 10^{13}/cm^2$ The portion impregnated with the n-type impurity is heat-treated at a temperature of 1000° C. or so. Thus, an n-type diffusion layer 5 is formed. Next, an isolation oxide film 7 is formed on the surface of the n-type epitaxial layer 4 by LOCOS (Local Oxidation of Silicon) process. The thickness of the isolation oxide film 7 preferably ranges from about 10000 Å to 20000 Å. Next, openings are provided at predetermined positions of the isolation oxide film 7 by photolithographic technology. Thus, the surface of the n-type epitaxial layer 4 is selectively exposed. A p-type impurity such as boron (B) is deposited on the exposed surface of the n-type epitaxial layer 4.

Thereafter, the surface with the p-type impurity deposited thereon is heat-treated at a temperature of about 1050° C. to thereby form p-type diffusion layers 6 within the n-type epitaxial layer 4. Thus, element isolation regions are formed by the p-type diffusion layers 6 and the p-type diffusion layers 3.

Next, openings are defined in predetermine positions of the isolation oxide film 7 by photolithographic technology. A p-type impurity such as boron (B) is implanted into the n-type epitaxial layer 4 within each opening at about $5\times10^{13}$ to $5\times10^{14}/cm^2$. The n-type epitaxial layer 4 impregnated with the p-type impurity is heat-treated at a temperature of 950° C. or so to thereby form p-type diffusion layers 8a and 8b as shown in FIG. 42. Next, openings are provided at predetermined positions of the isolation oxide film 7 by photolithographic technology. Further, an n-type impurity such as arsenic (As) is implanted into the n-type epitaxial layer 4 located within each opening at about $2.0\times10^{15}$ to $7.0\times10^{15}/cm^2$. Thereafter, the n-type epitaxial layer 4 impregnated with the n-type impurity is heat-treated at a temperature of about 1050° C. As a result, n-type diffusion layers 9a, 9b, 9c and 9d are formed. Next, polycrystalline silicon layers each ranging in thickness from about 1500 Å to 3000 Å are formed so as to cover the n-type epitaxial layer 4 and the isolation oxide film 7 by CVD (Chemical Vapor Deposition) process or the like. An n-type impurity such as arsenic (As) is implanted into each polycrystalline silicon layer at about $2.0\times10^{15}$ to $7.0\times10^{15}/cm^2$. Thereafter, the polycrystalline silicon layers are patterned. As a result, polycrystalline silicon layers 10a, 10b, 10c and 10d are respectively formed.

Next, an interlayer insulating layer 12 composed of a BPSG (Boro Phospho Silicate Glass) film or the like ranging in thickness from about 7000 Å to 12000 Å, is formed so as to cover the polycrystalline silicon layers 10a through 10d and the isolation oxide film 7 by CVD process. By selectively etching the interlayer insulating layer 12, contact holes 12a, 12b, 12c, 12d, 12e, 12f and 12g are respectively formed. Further, a p-type impurity such as BF2 is implanted into only the surface of each of the p-type diffusion layers 8a, 8b and 6 provided within the contact holes 12b, 12e and 12g at about $1.0\times10^{15}$ to $3.0\times10^{15}/cm^2$ using photolithographic technology and ion implantation technology. Thereafter, each surface impregnated with the p-type impurity is heat-treated at a temperature of about 950° C. As a result, p-type diffusion layers 11a, 11b and 11c are respectively formed. Afterwards, an AlSi layer 13 ranging in thickness from about 5000 Å to 10000 Å is deposited on the entire surface of the interlayer insulating layer 12. The AlSi layer 13 is patterned to form interconnection layers 13a, 13b, 13c, 13d, 13e, 13f and 13g as shown in FIG. 37. The conventional semiconductor device shown in FIG. 37 having the vertical pnp bipolar transistor is formed through the above steps.

In the conventional semiconductor device having the vertical pnp bipolar transistor as described above, the n-type buried diffusion layer 2 and the n-type buried diffusion layer 2a are formed in different steps. This is because it is necessary to set the concentration (about $10^{17}$ to $10^{18}/cm^3$) of the n-type impurity contained in the n-type buried diffusion layer 2a so as to become lower than the concentration (about $10^{19}/cm^3$) of the n-type impurity contained in the n-type buried diffusion layer 2 in order to ensure a withstand voltage between the n-type buried diffusion layer 2a and the p-type buried diffusion layer 3a. Further, the p-type diffusion layers 3 and the p-type diffusion layers 6 used for element isolation are formed in different steps. Therefore, a problem arises that the number of steps increases and the manufacturing cost rises.

Thus, an approach is considered to be adopted wherein the formation of the p-type diffusion layers 6 for the element isolation is omitted and by forming the p-type diffusion layers so that they extend from the surface of the n-type epitaxial layer 4 to the p-type silicon substrate 1 element isolation is performed and the n-type buried diffusion layer 2 and the n-type buried diffusion layer 2a are formed in the same step. As a result, the manufacturing cost can be reduced.

However, problems to be described below are brought about when the above approach is adopted to reduce the manufacturing cost. The problems will now be described with reference to FIG. 44. FIG. 44 is a partially cross-sectional view showing a semiconductor device having a vertical pnp bipolar transistor, wherein element isolation is performed by forming a p-type diffusion layer 16 for element isolation so that they extend from the surface of an n-type epitaxial layer 4 to a p-type silicon substrate 1 and an n-type buried diffusion layer 2a nd an n-type buried diffusion layer 2a are formed in the same step.

Referring to FIG. 44, the tubular shaped p-type diffusion layer 16 is formed so as to extend from the surface of the n-type epitaxial layer 4 to a main surface of the p-type silicon substrate 1. At this time, the p-type diffusion layer 16 is formed so as to substantially reach the n-type buried diffusion layer 2a. Structures other than above are substantially similar to those shown in FIG. 37.

Upon operation, as shown in FIG. 44, voltages ranging from 0(V) to the maximum voltage employed in an IC are applied to the n-type epitaxial layer 4. Further, a voltage of 0(V) is applied to a p-type diffusion layer 8b that serves as an emitter region and voltages ranging from about 0(V) to −1(V) are applied to an n-type diffusion layer 5 which serves as a base region. Furthermore, a voltage of about −5(V) is applied to the p-type diffusion layer 16 and the p-type buried diffusion layer 3a which serve as a collector region.

Thus, a portion at which the p-type diffusion layer 16 and the p-type buried diffusion layer 3a are joined to the n-type buried diffusion layer 2a and the n-type epitaxial layer 4, is brought into a reverse-biased state. Namely, a portion at which the collector region of the vertical pnp bipolar transistor is joined to a region about the collector region, is brought into the reverse-biased state.

At this time, the withstand voltage between the collector region and the region thereabout is maintained by a widening effect of a depletion layer 15 in the region about the collector region. However, in portions at which corners 17 of a ring-like lower end of the p-type diffusion layer 16 overlap with the p-type buried diffusion layer 3a, the concentration of a p-type impurity is very high as compared with other regions. Therefore, the widening effect of the depletion layer 15 is retrained in the vicinity of a region in which the corners 17 of the p-type diffusion layer 16 is joined to the n-type buried diffusion layer 2a. Thus, a problem arises that the concentration of an electric field at the corner 17 of the p-type diffusion layer 16 is apt to occur and the reliability of each vertical pnp bipolar transistor is reduced.

SUMMARY OF THE INVENTION

With the foregoing problems in view, it is therefore an object of the present invention to provide a semiconductor device having a vertical pnp bipolar transistor, which is capable of reducing the manufacturing cost and increasing its reliability and to a method of manufacturing the semiconductor device.

According to one aspect of the present invention, there is provided a bipolar transistor comprising a first conductivity type semiconductor substrate having a main surface, a second conductivity type semiconductor layer, a second conductivity type buried diffusion layer, a second conductivity type base region, a collector region and a first conductivity type emitter region. The semiconductor layer is formed on the main surface of the semiconductor substrate. The buried diffusion layer is formed extending in both the semiconductor layer and the semiconductor substrate. The base region is formed in a surface of the semiconductor layer located above the buried diffusion layer. The collector region is made up of a first conductivity type first region and a first conductivity type second region. The first region is of a tubular shaped region which surrounds side ends of the base region and extends through the semiconductor layer so as to reach the buried diffusion layer. The second region is formed so as to overlap with a lower end of the first region exclusive of an outer lower end of the first region and have a bottom face within the buried diffusion layer. The emitter region is formed in the surface of the base region.

According to one aspect of the present invention, as described above, the outer lower end of the tubular shaped first region which serves as a part of the collector region, does not overlap with the second region which constitutes a part of the collector region. It is thus possible to reduce the concentration of a first conductivity type impurity contained in each of outer lower end corners of the first region. Namely, the concentration of the first conductivity type impurity contained in each outer lower end corners of the collector region, which has the most apprehension of degradation in withstand voltage between the collector region and its peripheral region, can be controlled low. It is therefore possible to effectively restrain the withstand voltage between the collector region and the region about the collector region from being degraded.

According to another aspect of the present invention, there is provided a semiconductor device having bipolar transistors, comprising a first conductivity type semiconductor substrate having a main surface, a second conductivity type semiconductor layer, first and second conductivity type buried diffusion layers, a first conductivity type first base region, a second conductivity type first emitter region, a first conductivity type element isolation region, a second conductivity type second base region, a first conductivity type second emitter region and a second collector region. The semiconductor layer is formed on the main surface of the semiconductor substrate. The first and second buried diffusion layers are formed extending in both the semiconductor substrate and the semiconductor layer with an interval defined therebetween. The first and second buried diffusion layers respectively contain second conductivity type impurities identical in concentration to each other. The first base region is formed in a surface of the semiconductor layer located above the first buried diffusion layer. The first emitter region is formed in a surface of the first base region. The element isolation region surrounds a region within the semiconductor layer, which is provided around the first base region and serves as a first collector region. Further, the element isolation region extends through the semiconductor layer so as to reach the semiconductor substrate. The second base region is formed in a surface of the semiconductor layer located above the second buried diffusion layer. The second emitter region is formed in a surface of the second base region. The collector region is composed of a first conductivity type first region and a first conductivity type second region. The first region is of a tubular shaped region which surrounds side ends of the second base region and extends through the semiconductor layer so as to reach the second buried diffusion layer. The second region overlaps with a lower end of the first region exclusive of an outer lower end of the first region and is formed so as to have a bottom face within the second buried diffusion layer.

According to another aspect of the present invention, as described above, the second conductivity type impurities contained in the first and second buried diffusion layers are set so as to become identical in concentration to one another. Thus, the first and second buried diffusion layers can be formed in the same step. Since the element isolation region and the first region are formed so as to extend through the semiconductor layer, the manufacturing cost can be reduced as compared with the conventional example shown in FIG. 37. Further, since the corners of the outer lower end of the first region and the second region do not overlap with each other, a withstand voltage between the collector region and its peripheral region can be effectively restrained from being degraded in a manner similar to the bipolar transistor according to the one aspect of the present invention.

According to a further aspect of the present invention, there is provided a bipolar transistor comprising a first conductivity type semiconductor substrate having a main surface, a second conductivity type semiconductor layer, a second conductivity type buried diffusion layer, a second conductivity type base region, a collector region and a first conductivity type emitter region. The semiconductor layer is formed on the main surface of the semiconductor substrate. The buried diffusion layer is formed extending in both semiconductor layer and the semiconductor substrate. The base region is formed in a surface of the semiconductor layer located above the buried diffusion layer. The collector region consists of a first conductivity type first region and a first conductivity type second region. The first region surrounds side ends of the base region and extends through the semiconductor layer so as to reach the buried diffusion layer. The first region has a tubular shaped lower end. The concentration of a first conductivity type impurity contained in each of corners of the tubular shaped lower end is lower than that of a first conductivity type impurity contained in a region within the tubular shaped lower end adjacent to the corners. The second region overlaps with at least an inner lower end of the first region and is formed so as to have a bottom face within the buried diffusion layer. The emitter region is formed in a surface of the base region.

According to the further aspect of the present invention, as described above, the concentration of the first conductivity type impurity contained in each of the corners of the lower end of the first region is set so as to become lower than that of the first conductivity type impurity contained in the first region adjacent to the corners. Thus, the concentration of an electric field at each of the corners of the lower end of the first region, i.e., each of the corners of the lower end of the collector region, can be effectively restrained from occurring. Namely, a withstand voltage between the collector region and its peripheral region can be effectively restrained from degradation.

According to a still further aspect of the present invention, there is provided a bipolar transistor comprising a first conductivity type semiconductor substrate having a main surface, a second conductivity type semiconductor layer, a second conductivity type buried diffusion layer, a second conductivity type base region, a collector region and a first conductivity type emitter region. The semiconductor layer is formed on the main surface of the semiconductor substrate. The buried diffusion layer is formed extending in both the semiconductor layer and the semiconductor substrate. The base region is formed in a surface of the semiconductor layer located above the buried diffusion layer. The collector region is made up of a first conductivity type first region and a first conductivity type second region. The first region is formed just below a bottom of the base region so as to have a bottom face within the buried diffusion layer. The second region extends through the base region so as to surround a region exclusive of side ends of the base region and is formed so as to reach the first region. The emitter region is formed in a surface of the base region.

According to the still further aspect of the present invention, as described above, the second region is formed so as to extend through the base region to reach the first region. Even if an element isolation region for isolating between the bipolar transistor and its peripheral region and the second region are formed in the same step by setting the concentration of a second conductivity type impurity contained in the base region so as to become higher than that of a second conductivity type impurity contained in the semiconductor layer where the element isolation region is formed within the semiconductor layer, the element isolation region can be formed so as to reach the semiconductor substrate and a lower end of the second region can be formed not so as to reach the bottom face of the first region. Thus, in a manner similar to the semiconductor device having the bipolar transistors, according to the one aspect of the present invention, the manufacturing cost can be reduced and the concentration of a first conductivity type impurity contained in each corner of a lower end of a corresponding collector region can be controlled lower as compared with the conventional example shown in FIG. 37 in a manner similar to the above other aspects. As a result, a withstand voltage at each corner of the lower end of the corresponding collector region can be effectively restrained from being degraded.

According to a still further aspect of the present invention, there is provided a semiconductor device having bipolar transistors, comprising a first conductivity type semiconductor substrate having a main surface, a second conductivity type semiconductor layer, a second conductivity type buried diffusion layer, a second conductivity type base region, a collector region, a first conductivity type emitter region and a first conductivity type element isolation region. The semiconductor layer is formed on the main surface of the semiconductor substrate. The buried diffusion layer is formed extending in both the semiconductor layer and the semiconductor substrate. The base region is formed in a surface of the semiconductor layer located above the buried diffusion layer. The collector region consists of a first conductivity type first region and a first conductivity type second region. The first region is formed just below the bottom of the base region so as to have a bottom face within the buried diffusion layer. The second region is formed within the semiconductor layer so as to surround side ends of the base region and reach the first region. Further, the second region has a first plane width smaller than the thickness of the semiconductor layer. The emitter region is formed in a surface of the base region. The element isolation region is formed within the semiconductor layer surrounding the collector region and the buried diffusion layer. Further, the element isolation region has a second plane width greater than or equal to the thickness of the semiconductor layer and extends through the semiconductor layer so as to reach the main surface of the semiconductor substrate.

According to the still further aspect of the present invention, as described above, the plane width of the second region is set so as to become smaller than the thickness of the semiconductor layer. Further, the plane width of the element isolation region is set so as to become more than or equal to the thickness of the semiconductor layer. Thus, even when the second region and the element isolation region are formed in the same step, the element isolation region can be formed so as to extend through the semiconductor layer in order to reach the semiconductor substrate. Further, the bottom face of the second region can be held within the first region not so as to reach the bottom face of the first region. Even in this case, the concentration of a first conductivity type impurity contained in each corner of a lower end of a corresponding collector region can be controlled low. As a result, a withstand voltage at each corner of the lower end of the corresponding collector region can be effectively restrained from being degraded.

According to a still further aspect of the present invention, a bipolar transistor comprising a first conductivity type semiconductor substrate having a main surface, a second conductivity type semiconductor layer, a second conductivity type buried diffusion layer, a second conductivity type base region, a collector region and a first conductivity type emitter region. The semiconductor layer is formed on the main surface of the semiconductor substrate. The buried diffusion layer is formed extending in both the semiconductor layer and the semiconductor substrate. The base region is formed in a surface of the semiconductor layer located above the buried diffusion layer. The collector region is made up of a first conductivity type first region and a first conductivity type second region. The first region is formed just below a bottom of the base region so as to have a bottom face within the buried diffusion layer. The concentration of a first conductivity type impurity contained in the bottom thereof is lower than that of a first conductivity type impurity contained in the first region other than the bottom thereof. The second region is of a tubular shaped region formed so as to surround side ends of the base region and so as to extend through the semiconductor layer in order to reach the first region. The emitter region is formed in a surface of the base region.

According to the still further aspect of the present invention, as described above, the concentration of the first conductivity type impurity contained in the bottom of the first region having the bottom face within the buried diffusion layer is set so as to become lower than that of the first conductivity type impurity contained in the portion other than the bottom. Thus, even when the second region is formed so as to reach the bottom face of the first region, the concentration of the first conductivity type impurity contained in each corner of a lower end of a corresponding collector region can be lowered as compared with the example shown in FIG. 44. As a result, a withstand voltage at each corner of the lower end of the corresponding collector region can be effectively restrained from being degraded.

According to a still further aspect of the present invention, there is provided a bipolar transistor comprising a first conductivity type semiconductor substrate having a main surface, a second conductivity type semiconductor layer, a second conductivity type buried diffusion layer, a second conductivity type base region, a collector region and a first conductivity type emitter region. The semiconductor layer is formed on the main surface of the semiconductor substrate. The buried diffusion layer is formed extending in both semiconductor layer and the semiconductor substrate. The base region is formed in a surface of the semiconductor layer located above the buried diffusion layer. The collector region comprises a first conductivity type first region and a first conductivity type second region. The first region is formed just below a bottom of the base region so as to have a bottom face within the buried diffusion layer. Further, a height of an upper surface of the first region from an interface between the semiconductor layer and the semiconductor substrate is two-third or more the thickness of the semiconductor layer. The second region is formed within the semiconductor layer so as to surround side ends of the base region and reach the first region. The emitter region is formed in a surface of the base region.

According to the still further aspect of the present invention, as described above, the height of the upper surface of the first region from the interface between the semiconductor layer and the semiconductor substrate is set so as to become two-third or more the thickness of the semiconductor layer. Thus, when a bipolar transistor opposite in conductivity type to the present bipolar transistor is provided at a position where this reverse conductivity type bipolar transistor adjoins to the bipolar transistor, the second region can be formed in a step similar to a base region of the bipolar transistor adjacent thereto. Further, the first region can be expanded by setting the height of the upper surface of the first region to a relatively high value. Therefore, the concentration of a first conductivity type impurity contained in the first region can be relatively lowered. Further, the second region can reach the first region but can be formed not so as to reach the bottom face of the first region owing to the formation of the second region in the same step as the base region of the adjacent bipolar transistor as described above. Thus, the concentration of a first conductivity type impurity contained in each corner of a lower end of a corresponding collector region can be controlled low. As a result, a withstand voltage at each corner of the lower end of the corresponding collector region can be effectively restrained from degradation.

According to a still further aspect of the present invention, there is provided a semiconductor device having bipolar transistors, comprising a first conductivity type semiconductor substrate having a main surface, a second conductivity type semiconductor layer, second conductivity type first and second buried diffusion layers, a first conductivity type first base region, a second conductivity type first emitter region, a first conductivity type element isolation region, a second conductivity type second base region, a second collector region and a first conductivity type second emitter region. The semiconductor layer is formed on the main surface of the semiconductor substrate. The first and second buried diffusion layers are formed extending in both the semiconductor layer and the semiconductor substrate with an interval defined therebetween and respectively contain second conductivity type impurities identical in concentration to each other. The first base region is formed in a surface of the semiconductor layer located above the first buried diffusion layer. The first emitter region is formed in a surface of the first base region. The element isolation region surrounds a region formed within the semiconductor layer, which is provided around the first base region and serves as a first collector region. Further, the element isolation region extends through the semiconductor layer so as to reach the semiconductor substrate. The second base region is formed in a surface of the semiconductor layer located above the second buried diffusion layer. The second collector region is constructed of a first conductivity type first region and a first conductivity type second region. The first region is formed just below a bottom of the second base region so as to have a bottom face within the second buried diffusion layer. Further, a height of an upper surface of the first region from an interface between the semiconductor layer and the semiconductor substrate is two-third or more the thickness of the semiconductor layer. The second region is formed within the semiconductor layer so as to surround side ends of the second base region, have a diffusion depth equal to that of the first base region and reach the first region. The second emitter region is formed in a surface of the second base region.

According to the still further aspect of the present invention, as described above, the first base region and the second base region can be formed in the same step. Further, the element isolation region can be formed so as to extend through the semiconductor layer in order to reach the semiconductor substrate. Therefore, the manufacturing cost can be reduced as compared with the conventional example illustrated in FIG. 37. Owing to the formation of the second region and the first base region in the same step, the bottom face of the second region can also be prevented from reaching the bottom face of the first region. Thus, the concentration of a first conductivity type impurity contained in each corner of a lower end of a corresponding collector region can be lowered. As a result, a withstand voltage at each corner of the lower end of the corresponding collector region can be effectively restrained from degradation.

According to one aspect of the present invention, there is provided a method of manufacturing a semiconductor device having a bipolar transistor, comprising the steps of selectively introducing a second conductivity type impurity into a main surface of a first conductivity type semiconductor substrate to thereby form second conductivity type first and second impurity diffusion layers with an interval defined therebetween; introducing a first conductivity type impurity into a surface of the first impurity diffusion layer to thereby form a first conductivity type third impurity diffusion layer; forming a second conductivity type semiconductor layer on the main surface of the semiconductor substrate by an epitaxial growth process to thereby form second conductivity type first and second buried diffusion layers extending in both semiconductor layer and the semiconductor substrate and form a first conductivity type first region on the first buried diffusion layer as a part of a first collector region; introducing a second conductivity type impurity into a surface of the semiconductor layer located above the first region, to thereby form a first base region; forming a first conductivity type element isolation region so as to surround a region formed within the semiconductor layer, which is disposed above the second buried diffusion layer and serves as a second collector region and so as to reach the semiconductor substrate and simultaneously forming a first conductivity type second region serving as a part of the first collector region so as to overlap both side ends of the first region and the semiconductor layer around the side ends thereof and reach the first buried diffusion layer; introducing a first conductivity type impurity into a surface of the semiconductor layer located above the second buried diffusion layer, to thereby form a second base region; introducing a second conductivity type impurity into a surface of the second base region to thereby form a second emitter region; and introducing a first conductivity type impurity into a surface of the first base region to thereby form a first emitter region.

According to the method in one aspect of the present invention, as described above, the element isolation region can be formed so as to extend through the semiconductor layer and the element isolation region and the second region can be formed in the same step. Therefore, the manufacturing cost can be reduced. Upon forming the second region, the second region is formed so as to overlap both the side ends of the first region and the semiconductor layer around the side ends of the first region. Thus, the concentration of a first conductivity type impurity contained in each corner of a lower end of a corresponding collector region can be controlled low.

According to another aspect of the present invention, there is provided a method of manufacturing a semiconductor device having a bipolar transistor, comprising the steps of selectively introducing a second conductivity type impurity into a main surface of a first conductivity type semiconductor substrate to thereby form second conductivity type first and second impurity diffusion layers with an interval defined therebetween; introducing a first conductivity type impurity into a surface of the first impurity diffusion layer to thereby form a first conductivity type third impurity diffusion layer; forming a second conductivity type semiconductor layer on the main surface of the semiconductor substrate by an epitaxial growth process to thereby form second conductivity type first and second buried diffusion layers extending in both the semiconductor layer and the semiconductor substrate and form a first conductivity type first region on the first buried diffusion layer as a part of a first collector region; introducing a second conductivity type impurity into a surface of the semiconductor layer located above the first region, to thereby form a first base region; forming a first conductivity type element isolation region so as to surround a region within the semiconductor layer, which is disposed above the second buried diffusion layer and serves as a second collector region, and to reach the semiconductor substrate and simultaneously forming a first conductivity type second region serving as a part of the first collector region so as to at least extend through the first base region in order to reach the first region; introducing a first conductivity type impurity into a surface of the semiconductor layer located above the second buried diffusion layer, to thereby form a second base region; introducing a second conductivity type impurity into a surface of the second base region to thereby form a second emitter region; and introducing a first conductivity type impurity into a surface of the first base region to thereby form a first emitter region.

According to the method in another aspect of the present invention, as described above, the second region is formed so as to extend through the first base region in order to reach the first region in accordance with the same step as the element isolation region. Therefore, the manufacturing cost can be reduced in a manner similar to the above aspect. Further, since the second region is formed so as to extend through the first base region containing the second conductivity type impurity whose concentration is higher than that of the second conductivity type impurity contained in the semiconductor layer, the second region can be reduced in diffusion depth as compared with the element isolation region. Thus, even if the element isolation region is formed so as to reach the semiconductor substrate, a bottom face of the second region can be formed not so as to reach a bottom face of the first region. As a result, the concentration of the first conductivity type impurity contained in each corner of a lower end of a corresponding collector region can be lowered.

According to a further aspect of the present invention, there is provided a method of manufacturing a semiconductor device having a bipolar transistor, comprising the steps of selectively introducing a second conductivity type impurity into a main surface of a first conductivity type semiconductor substrate to thereby form second conductivity type first and second impurity diffusion layers with an interval defined therebetween; introducing a first conductivity type impurity into a surface of the first impurity diffusion layer to thereby form a first conductivity type third impurity diffusion layer; forming a second conductivity type semiconductor layer on the main surface of the semiconductor substrate by an epitaxial growth process to thereby form second conductivity type first and second buried diffusion layers extending in both semiconductor layer and the semiconductor substrate and form a first conductivity type first region on the first buried diffusion layer as a part of a first collector region; introducing a first conductivity type impurity into a region of a surface of the semiconductor layer, which surrounds a region serving as a second collector region, within the semiconductor layer, said region being located above the second buried diffusion layer and effecting heat treatment on the so-processed region to thereby form a first conductivity type element isolation region reaching semiconductor substrate, and displacing an upper surface of the first region such that a height of the upper surface of the first region from an interface between the semiconductor layer and the semiconductor substrate is two-third or more the thickness of the semiconductor layer by the heat treatment; introducing a second conductivity type impurity into a surface of the semiconductor layer located above the first region, to thereby form a first base region; selectively introducing a first conductivity type impurity into surfaces of the semiconductor layer, which are respectively located above the first and second buried diffusion layers, to thereby form a second region within the semiconductor layer disposed on the first buried diffusion layer so as to surround the first base region and reach the first region and to form a second base region within the semiconductor layer disposed on the second buried diffusion layer; introducing a second conductivity type impurity into a surface of the second base region to thereby form a second emitter region; and introducing a first conductivity type impurity into a surface of the first base region to thereby form a first emitter region.

According to the method in further aspect of the present invention, as described above, when the element isolation region is formed, the upper surface of the first region is displaced such that the height up to the upper surface of the first region becomes two-third or more the thickness of the semiconductor layer. Therefore, the second region and the second base region can be formed in the same step. Consequently, the manufacturing cost can be reduced. Further, the second region can be relatively reduced in diffusion depth owing to the formation of the second region and the second base region in the same step. Thus, a bottom face of the second region can be effectively prevented from reaching a bottom face of the first region. As a result, the concentration of a first conductivity type impurity contained in each corner of a lower end of a corresponding collector region can be reduced as low as possible.

According to a still further aspect of the present invention, there is provided a method of manufacturing a semiconductor device having a bipolar transistor, comprising the steps of selectively introducing a second conductivity type impurity into a main surface of a first conductivity type semiconductor substrate to thereby form second conductivity type first and second impurity diffusion layers with an interval defined therebetween; introducing a first conductivity type impurity into a surface of the first impurity diffusion layer to thereby form a first conductivity type third impurity diffusion layer; forming a second conductivity type semiconductor layer on the main surface of the semiconductor substrate by an epitaxial growth process to thereby form second conductivity type first and second buried diffusion layers extending in both the semiconductor layer and the semiconductor substrate and form a first conductivity type first region on the first buried diffusion layer as a part of a first collector region; introducing a second conductivity type impurity into a surface of the semiconductor layer disposed above the first region to thereby form a first base region; introducing a first conductivity type impurity into a region of a surface of the semiconductor layer, which surrounds a region serving as a second collector region within the semiconductor layer, the region being located above the second conductivity type second buried diffusion layer and selectively introducing a first conductivity type impurity into a region which corresponds to the surface of the semiconductor layer and excludes corners, the surface surrounding the first base region; effecting diffusing processing on the first conductivity type impurity to thereby form a first conductivity type element isolation region surrounding the region within the semiconductor layer, which serves as the second collector region, and form a tubular shaped first conductivity type second region as a part of the first collector region so as to surround the first base region and reach the first region; introducing a first conductivity type impurity into a surface of the semiconductor layer disposed above the second buried diffusion layer to thereby form a second base region; introducing a second conductivity type impurity into a surface of the second base region to thereby form a second emitter region; and introducing a first conductivity type impurity into a surface of the first base region to thereby form a first emitter region.

According to the method in still further aspect of the present invention, as described above, the tubular shaped second region is formed by selectively introducing the first conductivity type impurity into the region which corresponds to the surface surrounding the first base region, of the semiconductor layer and excludes the corners and effecting the diffusion processing on the first conductivity type impurity. Therefore, the concentration of the first conductivity type impurity contained in each corner of the tubular shaped second region is relatively lowered as compared with other portion within the second region. Thus, the concentration of the first conductivity type impurity contained in each corner of a lower end of a corresponding collector region can be lowered. Even in the case of the present aspect, the element isolation region and the second region can be formed in the same step in a manner similar to the one aspect referred to above. It is therefore possible to reduce the manufacturing cost.

According to a still further aspect of the present invention, there is provided a method of manufacturing a semiconductor device having bipolar transistors, comprising the steps of selectively introducing a second conductivity type impurity into a main surface of a first conductivity type semiconductor substrate to thereby form first and second impurity diffusion layers with an interval defined therebetween, which are respectively composed of a first impurity region containing a relatively high-concentration second conductivity type impurity and a second impurity region surrounding the first impurity region and containing a relatively low-concentration second conductivity type impurity; introducing a first conductivity type impurity into a surface of the first impurity diffusion layer to thereby form a first conductivity type third impurity diffusion layer; forming a second conductivity type semiconductor layer on the main surface of the semiconductor substrate by an epitaxial growth process to thereby form second conductivity type first and second buried diffusion layers extending both the semiconductor layer and the semiconductor substrate and form a first conductivity type first region on the first buried diffusion layer as a part of a first collector region so as to cancel the first impurity region; introducing a second conductivity type impurity into a surface of the semiconductor layer located above the first region, to thereby form a first base region; forming a first conductivity type element isolation region so as to surround a region within the semiconductor layer, which is disposed above the second buried diffusion layer and serves as a second collector region, and to reach the semiconductor substrate and simultaneously forming a first conductivity type second region serving as a part of the first collector region so as to surround the first base region and reach the first region; introducing a first conductivity type impurity into a surface of the semiconductor layer located above the second buried diffusion layer, to thereby form a second base region; introducing a second conductivity type impurity into a surface of the second base region to thereby form a second emitter region; and introducing a first conductivity type impurity into a surface of the first base region to thereby form a first emitter region.

According to the method in still further aspect of the present invention, as described above, the first region is formed so as to cancel the first impurity region containing the relatively high-concentration second conductivity type impurity. Thus, the concentration of the first conductivity type impurity contained in the bottom of the first region can be lowered. Consequently, the concentration of the first conductivity type impurity contained in each corner of a lower end of a corresponding collector region can be held low.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Preferred embodiments of the present invention will hereinafter be described with reference to FIGS. 1 through 36.

[First Embodiment]

Figure 1:
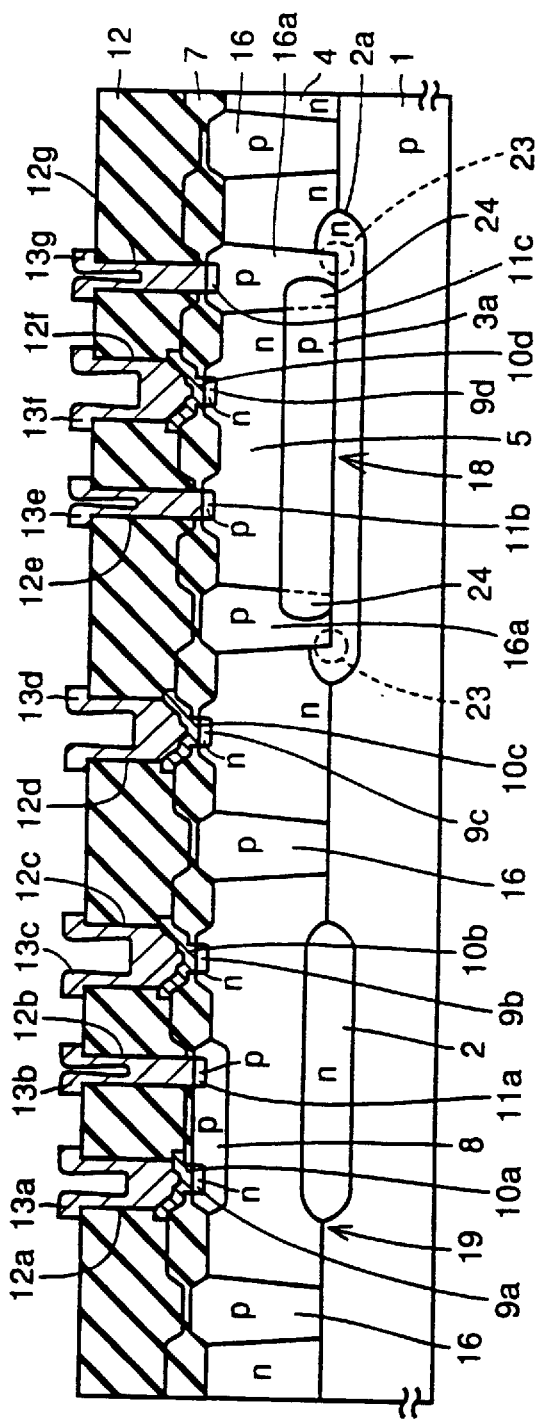
FIG. 1 is a cross-sectional view showing a semiconductor device having a vertical pnp bipolar transistor, according to a first embodiment of the present invention.
Figure 2:
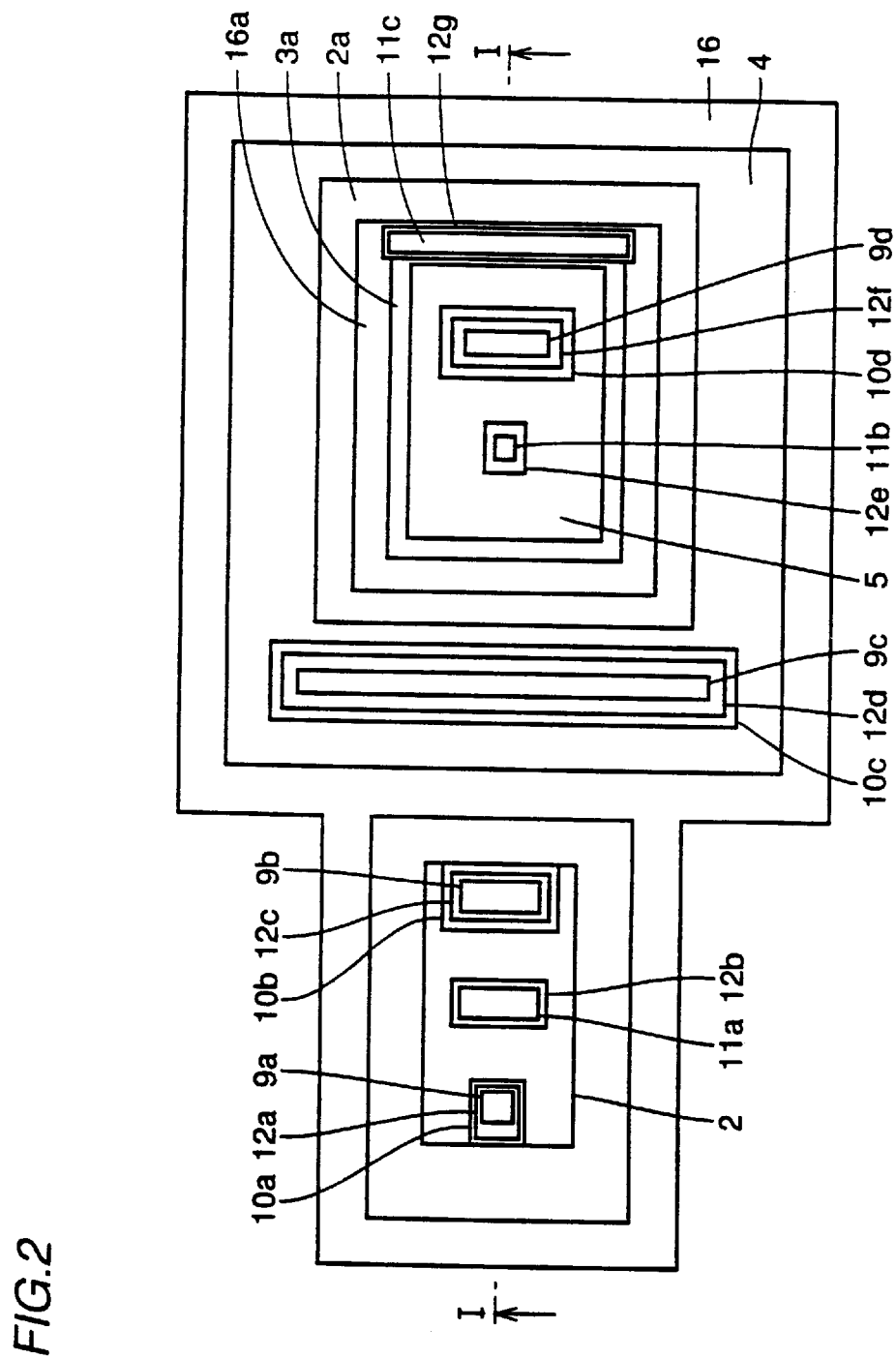
FIG. 2 is a plan view showing the semiconductor device shown in FIG. 1.

A first embodiment of the present invention will first be described using FIGS. 1 through 12. FIG. 1 is a cross-sectional view showing a semiconductor device having a vertical pnp bipolar transistor, according to the first embodiment of the present invention. FIG. 2 is a plan view of the semiconductor device shown in FIG. 1. A cross-section taken along line 1—1 line in FIG. 2 is shown in FIG. 1. The structure of the semiconductor device according to the present embodiment will be described with reference to FIGS. 2 and 1.

Referring to FIG. 1, an npn bipolar transistor 19 and a pnp bipolar transistor 18 are formed with an interval defined therebetween. The npn bipolar transistor 19 has regions formed within an n-type buried diffusion layer 2 and an n-type epitaxial layer 4, both of which serve as a collector region, a p-type diffusion layer 8 which serves as a base region, and an n-type diffusion layer 9a which serves as an emitter region. On the other hand, the pnp bipolar transistor 18 has a p-type diffusion layer 16a and a p-type buried diffusion layer 3a, both of which serve as a collector region, an n-type diffusion layer 5 which serves as a base region, and a p-type diffusion layer 11b which serves as an emitter region.

Figure 37:
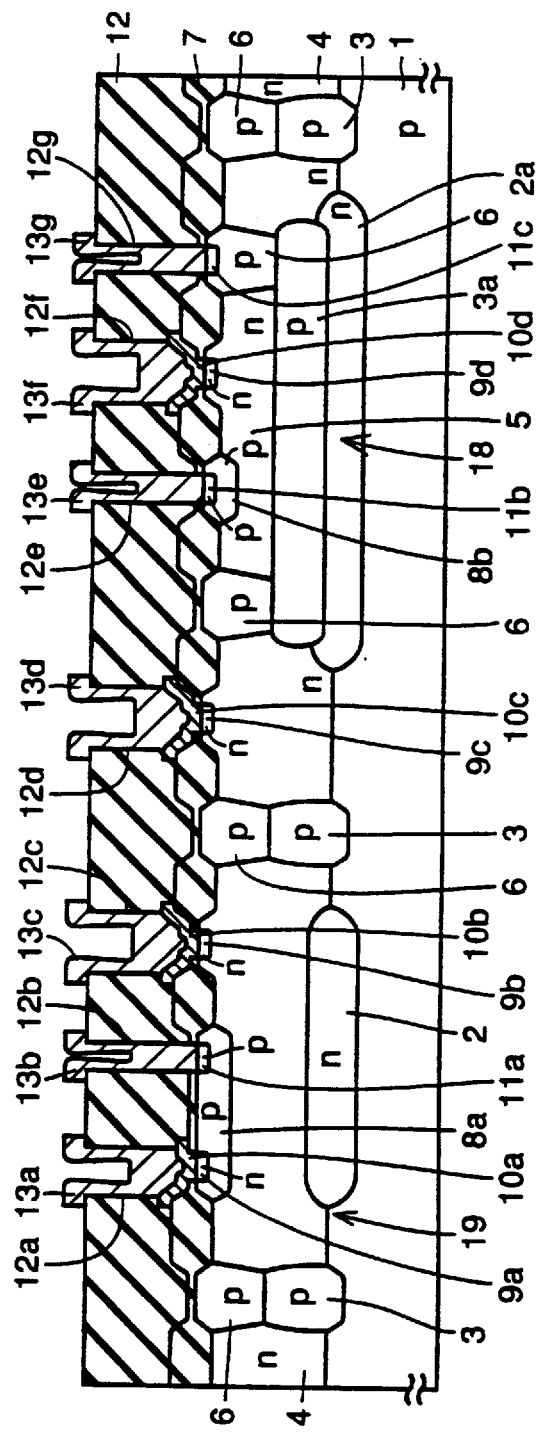
FIG. 37 is a cross-sectional view illustrating a conventional semiconductor device having a vertical pnp bipolar transistor.
Figure 38:
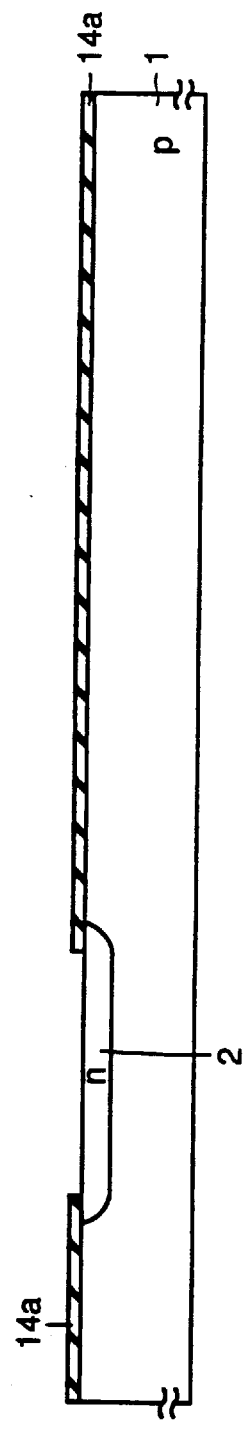
FIGS. 38 through 43 are respectively cross-sectional views showing first through sixth steps of a process for manufacturing the conventional semiconductor device shown in FIG. 37.
Figure 39:
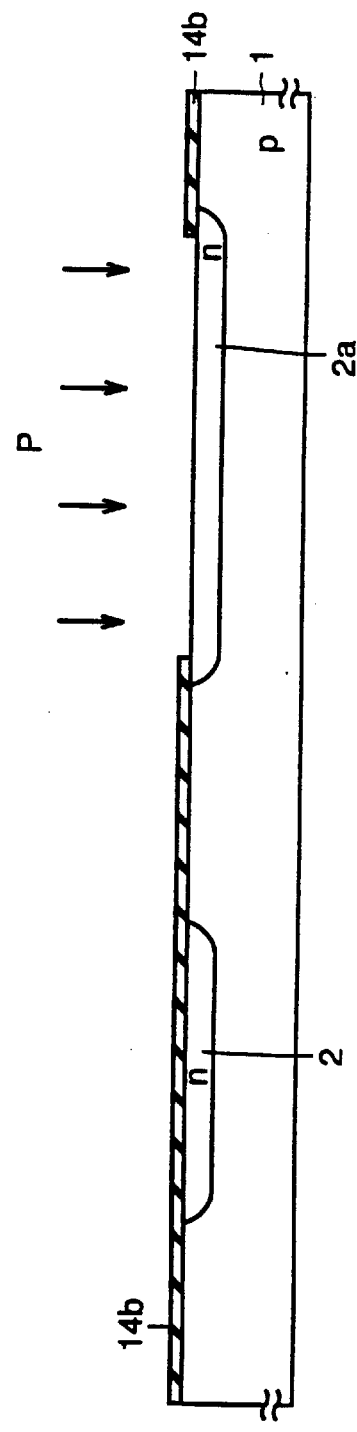
Figure 40:
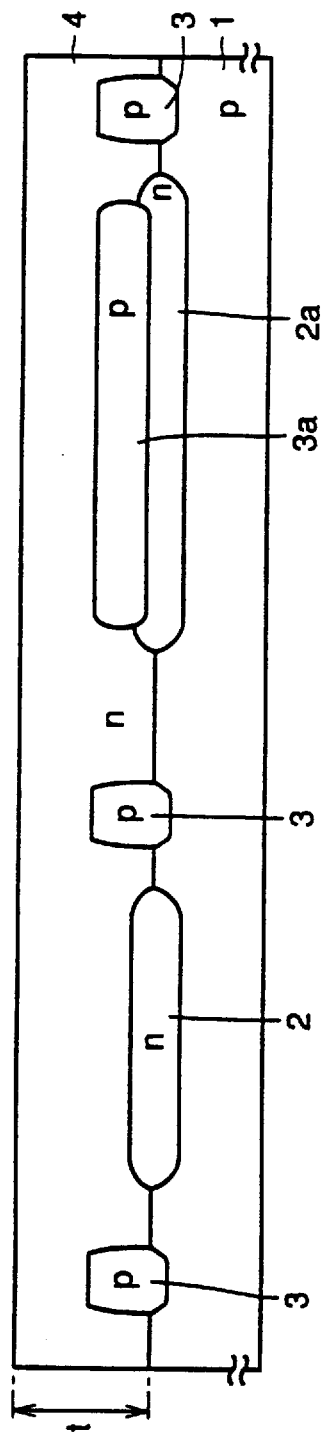
Figure 41:
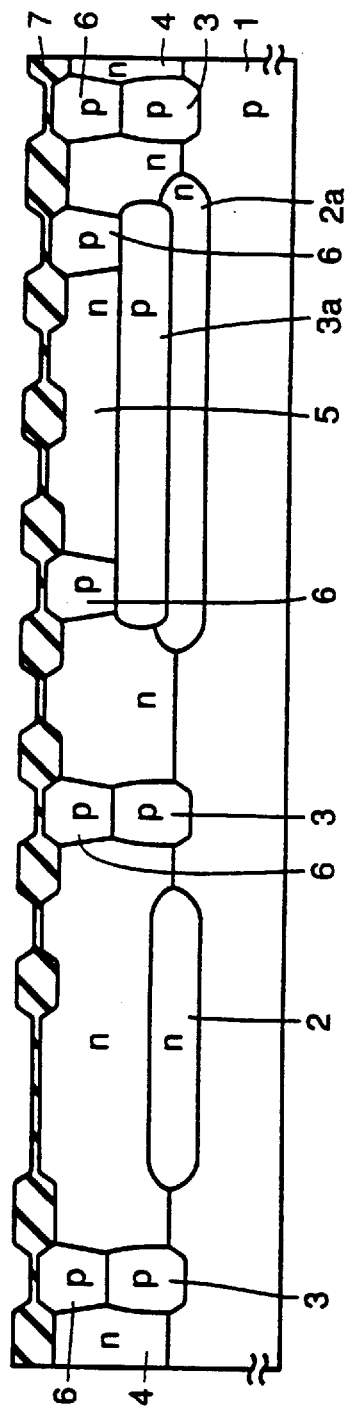
Figure 42:
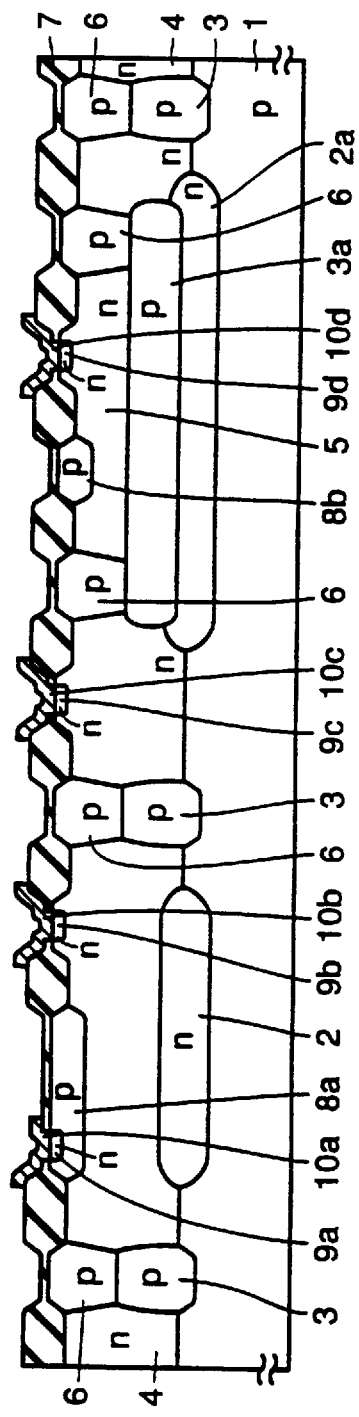
Figure 43:
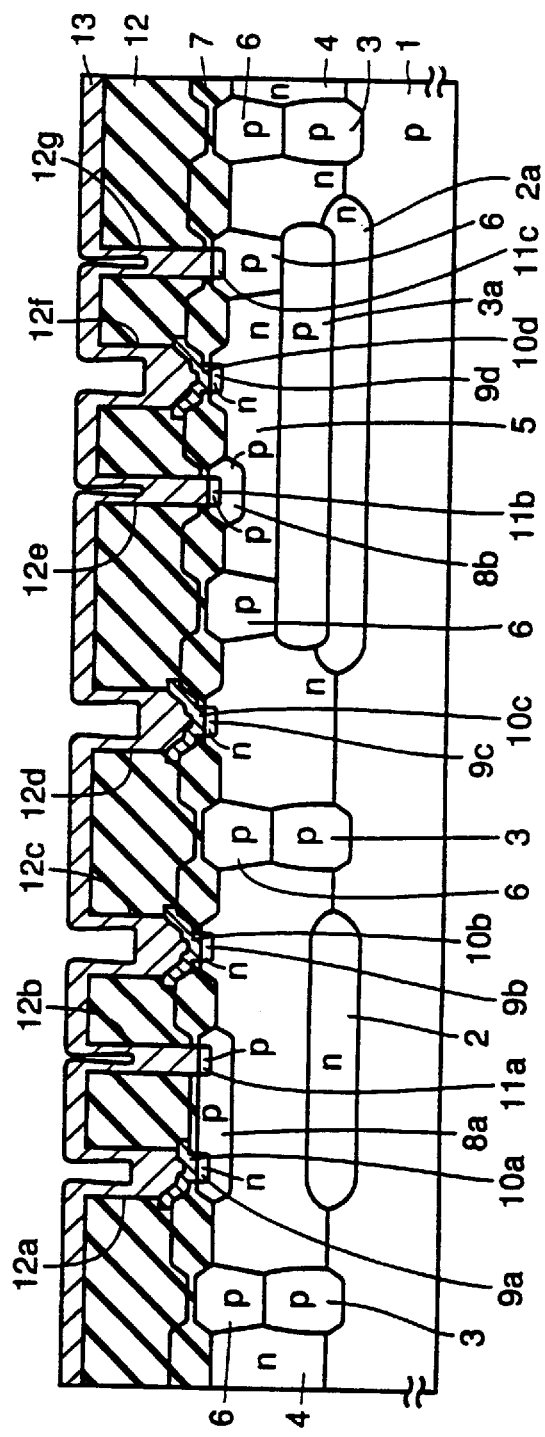

By a p-type diffusion layer 16, the npn bipolar transistor 19 and the pnp bipolar transistor 18 are isolated from each other. The p-type diffusion layer 16 is formed so as to extend from a surface of the n-type epitaxial layer 4 to a main surface of a p-type silicon substrate 1. It is thus unnecessary to respectively form the p-type diffusion layers 3 and the p-type diffusion layers 6 for the element isolation in different steps as in the conventional example shown in FIG. 37. Therefore, the manufacturing cost can be reduced.

Figure 44:
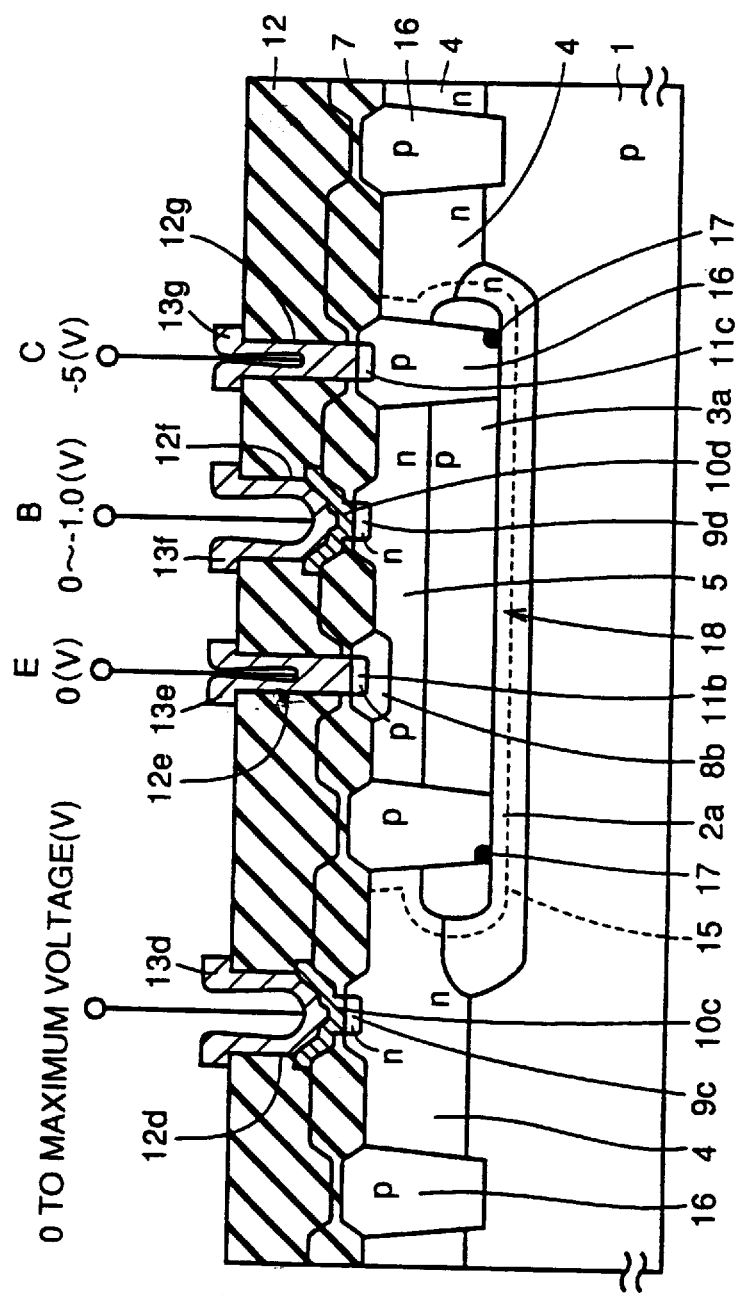
FIG. 44 is a cross-sectional view for describing problems of an improved example of the conventional semiconductor device shown in FIG. 37 having the vertical pnp bipolar transistor.

The p-type diffusion layer 16a and the p-type buried diffusion layer 3a are formed so that side end regions 24 of the p-type buried diffusion layer 3a do not overlap with outer lower-end corners 23 of the p-type diffusion layer 16a. Namely, the side end regions 24 of the p-type buried diffusion layer 3a are respectively provided inside the outer side ends of the p-type diffusion layer 16a. Thus, the concentration of a p-type impurity contained in the outer lower-end corners 23 of the collector region can be reduced as compared with that shown in FIG. 44. It is therefore possible to effectively restrain the generation of the concentration of an electric field near outer lower-end corner 23. As a result, a withstand voltage between the collector region in the pnp bipolar transistor 18 and its peripheral region cannot be degraded.

Since the withstand voltage between the collector region of the pnp bipolar transistor 18 and its peripheral region cannot be degraded as described above, an n-type impurity contained in the n-type buried diffusion layer 2 and the n-type buried diffusion layer 2a are made identical in concentration to each other. Thus, the n-type buried diffusion layer 2a and the n-type buried diffusion layer 2a can be formed in the same step. It is therefore possible to reduce the manufacturing cost. Further, the p-type diffusion layer 11b composed of boron (B) or BF2 implanted therein to reduce a contact resistance between an interconnection layer 13e and the n-type epitaxial layer 4 doubles as the emitter region of the pnp bipolar transistor 18. Thus, the way of doubling the p-type diffusion layer 11b as the emitter region can be applied even to the case where the thickness of the n-type epitaxial layer 4 is made thin. Since the p-type diffusion layer 11b is formed in the same step as that for forming each of a p-type diffusion layer 11a and a p-type diffusion layer 11c, the manufacturing cost is not increased.

A mechanism for improving the withstand voltage between the collector region of the vertical pnp bipolar transistor and its peripheral region (which contains the n-type epitaxial layer 4 and the n-type buried diffusion layer 2a) will now be described.

By providing the side end regions 24 of the p-type buried diffusion layer 3a inside the outer side ends of the p-type diffusion layer 16a as shown in FIGS. 1 and 2, the outer lower-end corners 23 of the collector region are formed of the p-type diffusion layer 16a only. Namely, only the p-type diffusion layer 16a makes contact with the n-type buried diffusion layer 2a near the outer lower-end corners portion of the collector region. Thus, when a portion at which the collector region is joined to its peripheral region is reverse-biased, a depletion layer can be expanded into the p-type diffusion layer 16a. It is therefore possible to relax the concentration of the electric field generated near the outer lower-end corners of the collector region in the conventional example shown in FIG. 44. As a result, the withstand voltage between the collector region and its peripheral region can be improved.

Figure 3:
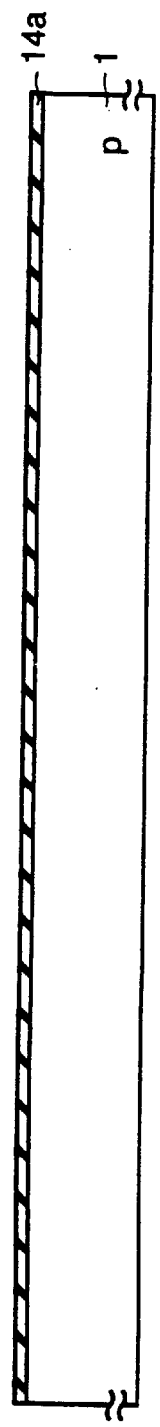
FIGS. 3 through 8 are respectively cross-sectional views illustrating first through sixth steps of a process for manufacturing the semiconductor device shown in FIG. 1.
Figure 4:
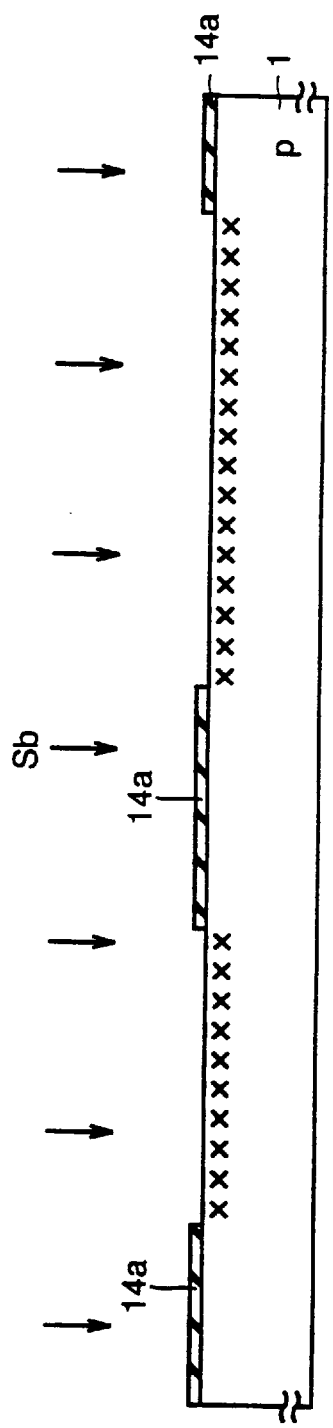
Figure 9:
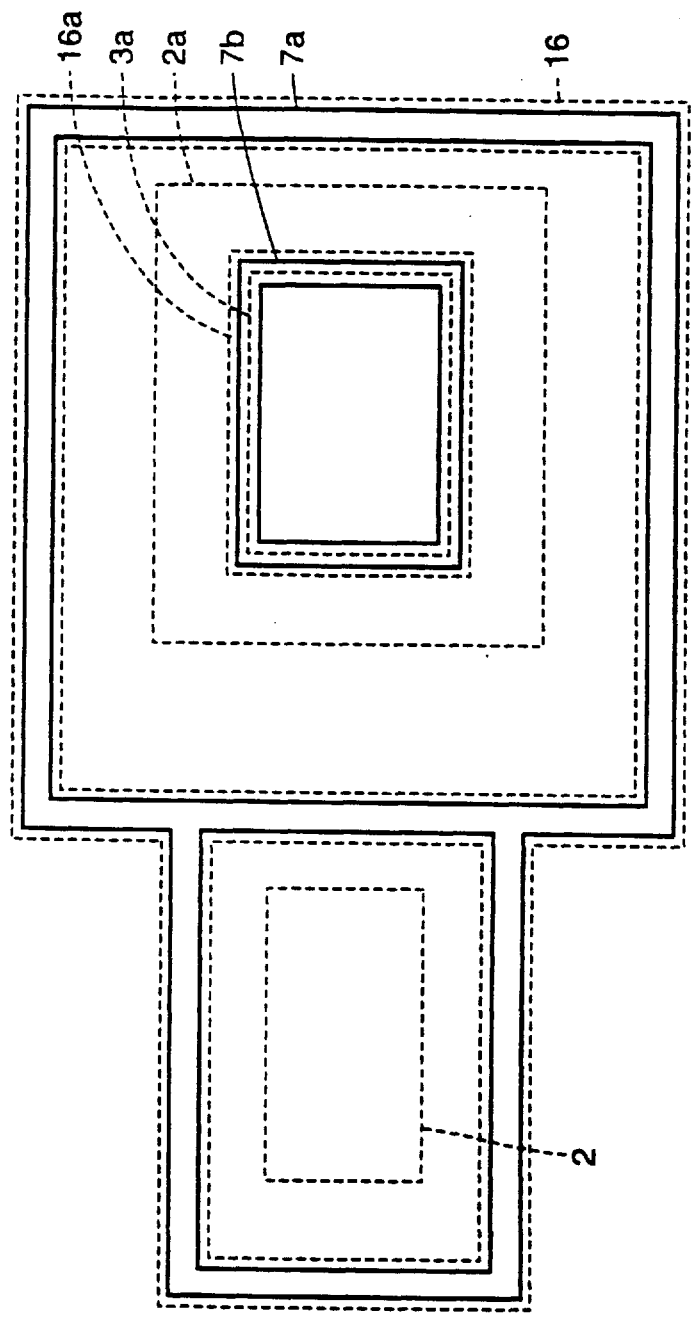
FIG. 9 is a plan view showing mask patterns for forming p-type diffusion layers for element isolation and p-type diffusion layers serving as a part of a collector region of a vertical pnp bipolar transistor.
Figure 10:
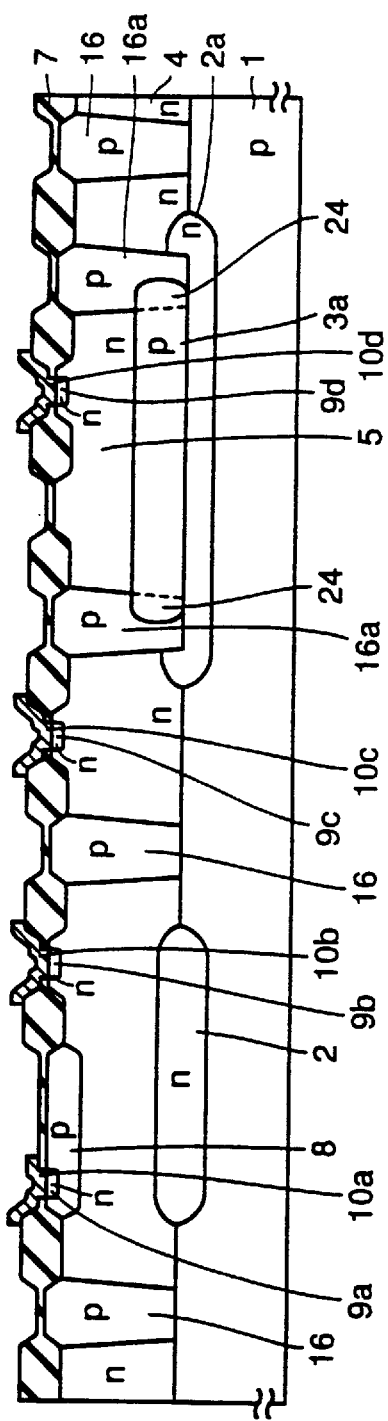
FIGS. 10 through 12 are respectively cross-sectional views showing seventh through ninth steps of a process for manufacturing the semiconductor device shown in FIG. 1.
Figure 11:
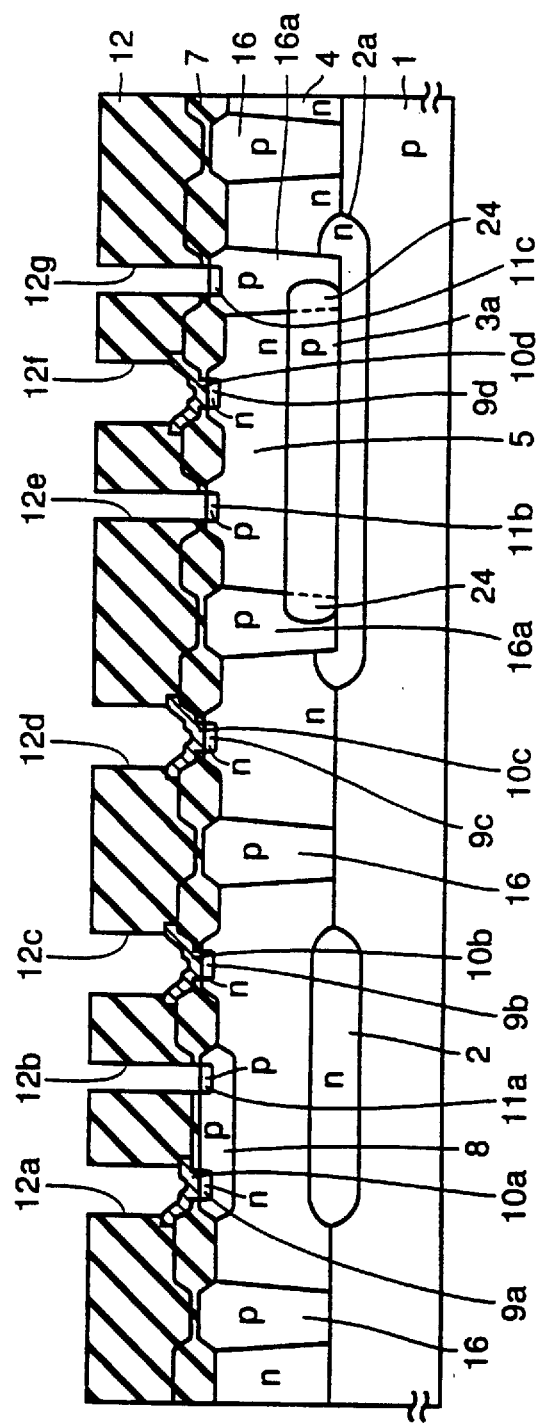
Figure 12:
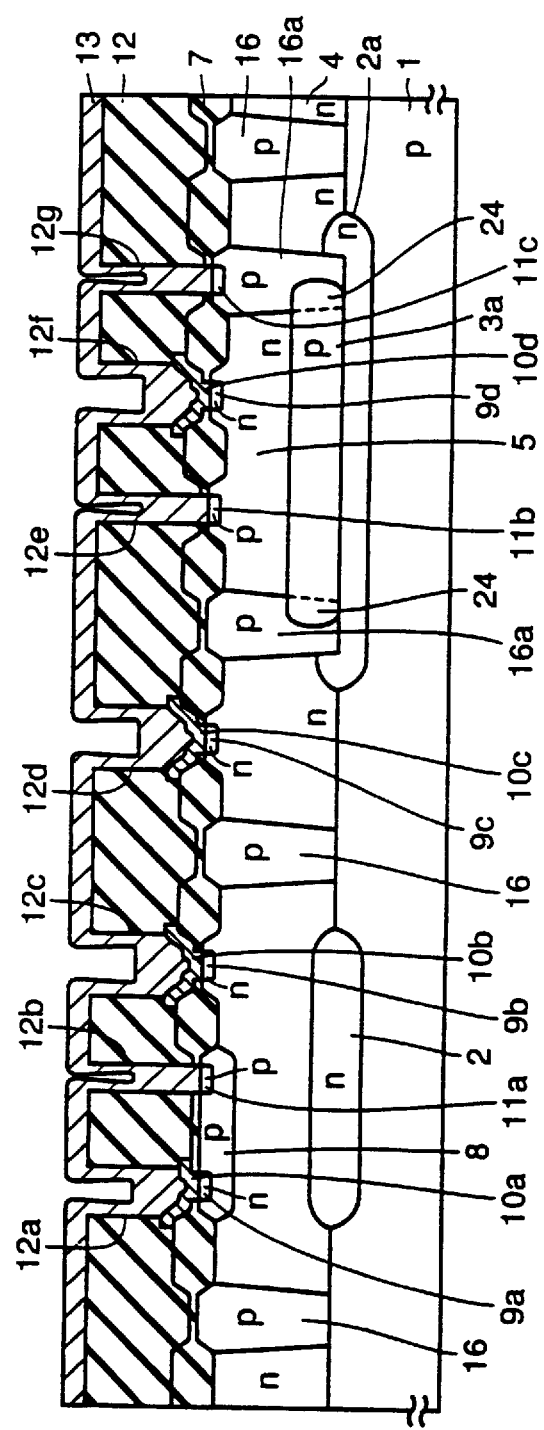

A method of manufacturing the semiconductor device shown in FIG. 1 will now be described with reference to FIGS. 3 through 12. FIGS. 3 through 8 are respectively cross-sectional views illustrating first through sixth steps of a process for manufacturing the semiconductor device according to the present invention. FIG. 9 is a plan view showing mask patterns for forming p-type diffusion layers 16 and 16a. FIGS. 10 through 12 are respectively cross-sectional views showing seventh through ninth steps of a process for manufacturing the semiconductor device according to the present invention. Referring first to FIG. 3, a silicon oxide film 14a ranging in thickness from about 5000 Å to 10000 Å is formed on a main surface of a p-type silicon substrate 1 by CVD process or the like. Next, the silicon oxide film 14a is selectively etched using photolithographic technology as shown in FIG. 4. As a result, the main surface of the p-type silicon substrate 1 is selectively exposed. Further, antimony (Sb) is implanted into the main surface of the p-type silicon substrate 1 at about $3.0 \times 10^{15}$ to $6.0 \times 10^{15}/cm^2$ by using the silicon oxide film 14a as a mask.

Figure 5:
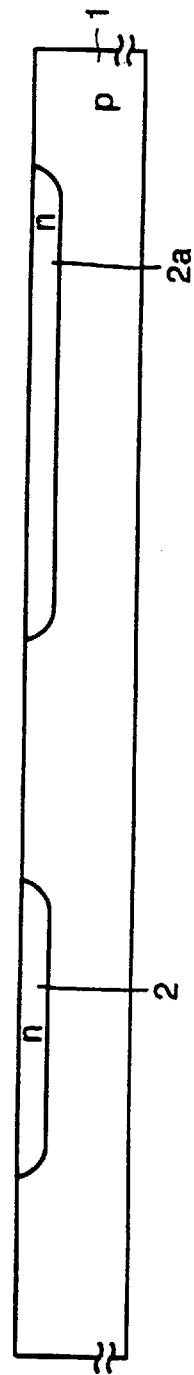

Thereafter, the main surface of the p-type silicon substrate 1 is heat-treated at a temperature of about 1100° C. so that n-type impurity diffusion layers 2 and 2a are respectively formed in the main surface of the p-type silicon substrate 1 as shown in FIG. 5. Afterwards, the silicon oxide film 14a is removed from the p-type silicon substrate 1.

Figure 6:
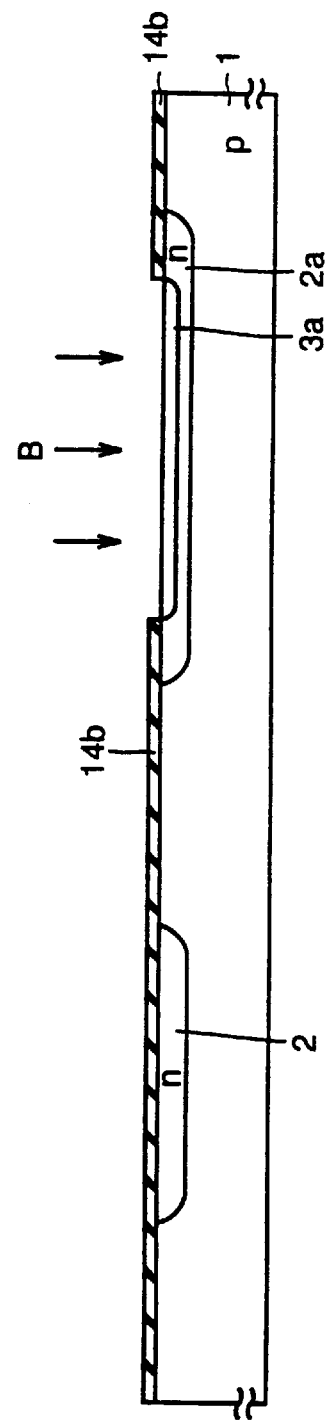

Next, a silicon oxide film 14b ranging in thickness from about 1000 Å to 2000 Å is formed on the main surface of the p-type silicon substrate 1 again by CVD process or the like as shown in FIG. 6. The silicon oxide film 14b is selectively etched using photolithographic technology. Thus, the surface of the n-type impurity diffusion layer 2a is partially exposed. Further, a p-type impurity such as boron (B) is implanted into the exposed surface of the n-type impurity diffusion layer 2a at about $3.0 \times 10^{14}$ to $5.0 \times 10^{14}/cm^2$. Thereafter, the exposed surface thereof is heat-treated at a temperature of about 1000° C. As a result, a p-type impurity diffusion layer 3a is formed on the surface of the n-type impurity diffusion layer 2a. Afterwards, the silicon oxide film 14b is removed from the p-type silicon substrate 1.

Figure 7:
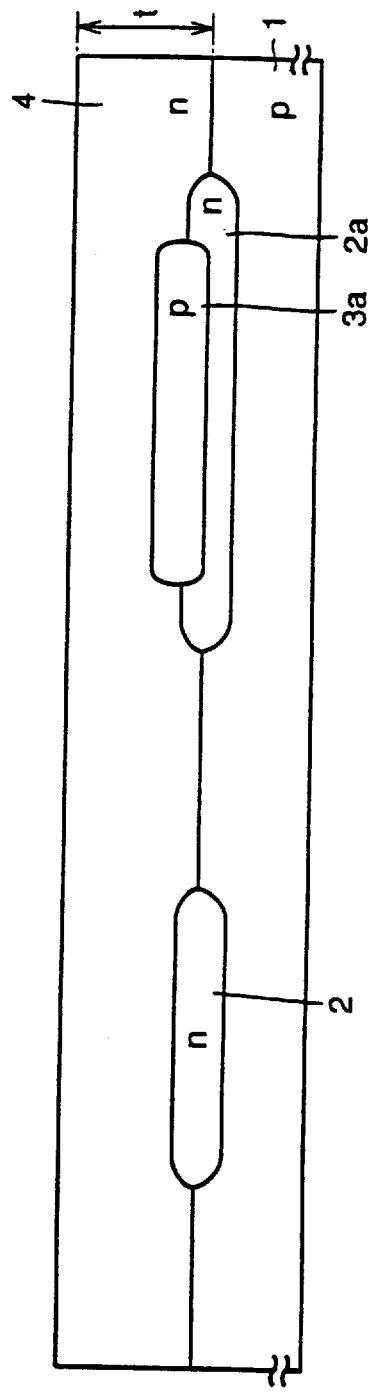

Next, an n-type epitaxial layer 4 is formed on the main surface of the p-type silicon substrate 1 by epitaxial growth process as shown in FIG. 7. Correspondingly, n-type buried diffusion layers 2 and 2a and a p-type buried diffusion layer 3a are formed. Incidentally, the thickness t of the n-type epitaxial layer 4 is preferably 3.0 μm or less.

Figure 8:
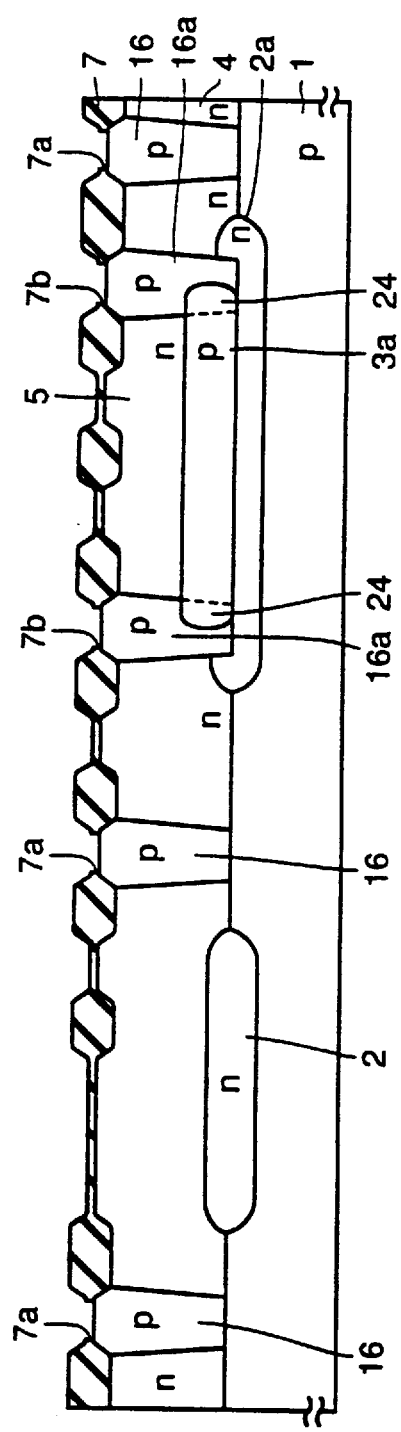

Referring next to FIG. 8, a silicon oxide film (not shown) ranging in thickness from about 300 Å to 1000 Å is formed on the surface of the n-type epitaxial layer 4 by CVD process or the like. Next, the silicon oxide film is selectively etched by using photolithographic technology. As a result, the surface of the n-type epitaxial layer 4 is partially exposed. Further, an n-type impurity such as phosphorus (P) is implanted into the exposed surface of the n-type epitaxial layer 4 at about $5 \times 10^{12}$ to $5 \times 10^{13}/cm^2$. Thereafter, the so-processed part of surface thereof is heat-treated at a temperature of about 1000° C. As a result, an n-type diffusion layer 5, which serves as a base region of each pnp bipolar transistor, is formed. Afterwards, an isolation oxide film 7 (in this specification, it is defined that an isolation oxide film 7 includes a thick portion and a thin portion integrated with the thick portion as shown in FIG. 8) is formed on the surface of the n-type epitaxial layer 4 by LOCOS process. The thickness of the thick portion of the isolation oxide film 7 preferably ranges from about 5000 Å to 10000 Å. Next, the isolation oxide film 7 is selectively etched using photolithographic technology. As a result, openings 7a and 7b for selectively exposing the surface of the n-type epitaxial layer 4 are defined. This state is shown in FIG. 9. The p-type impurity such as boron (B) is deposited on the surface of the n-type epitaxial layer 4 located within the openings 7a and 7b. The so-processed surface is heat-treated at temperatures of about 950° C. to 1050° C. As a result, p-type diffusion layers 16 and 16a are respectively formed. At this time, each of side end regions 24 of the p-type buried diffusion layer 3a and each of outer side ends of a p-type diffusion layer 16a are prevented from overlapping with each other. It is preferable that the p-type diffusion layer 16 reaches the main surface of the p-type silicon substrate 1. However, even if the p-type diffusion layer 16 does not reach the main surface of the p-type silicon substrate 1 in this stage, the p-type diffusion layer 16 may reach the p-type silicon substrate 1 upon process completion.

Referring next to FIG. 10, a surface of the n-type epitaxial layer 4 is selectively exposed using photolithographic technology. Further, a p-type impurity such as boron (B) is implanted into the exposed surface thereof at about $5 \times 10^{13}$ to $5 \times 10^{14}/cm^2$. Thereafter, the so-processed part of surface is heat-treated at a temperature of about 950° C. As a result, a p-type diffusion layer 8 is formed at the surface of the n-type epitaxial layer 4. The p-type diffusion layer 8 serves as a base region of an npn bipolar transistor. Next, a predetermined region on the surface of the n-type epitaxial layer 4 is selectively exposed using photolithographic technology. Further, an n-type impurity such as arsenic (As) is implanted into the exposed surface of the n-type epitaxial layer 4 at about $2.0 \times 10^{15}$ to $6.0 \times 10^{15}/cm^2$ and the so-processed surface is heat-treated at a temperature of about 1050° C. As a result, n-type diffusion layers 9a, 9b, 9c and 9d are respectively formed. Thereafter, polycrystalline silicon layers each ranging in thickness from about 1500 Å to 3000 Å are deposited on the surfaces of the n-type diffusion layers 9a through 9d and the isolation oxide film 7 by CVD process or the like. Further, the n-type impurity such as arsenic (As) is implanted into the polycrystalline silicon layers at about $2.0 \times 10^{15}$ to $6.0 \times 10^{15}/cm^2$. Afterwards, the polycrystalline silicon layers are patterned. As a result, polycrystalline silicon layers 10a, 10b, 10c and 10d are respectively formed.

Referring now to FIG. 11, an interlayer insulating layer 12 composed of a BPSG film is formed so as to cover the isolation oxide film 7 and the polycrystalline silicon layers 10a through 10d by CVD process or the like. The thickness of the interlayer insulating layer 12 preferably ranges from about 7000 Å to 12000 Å. Next, the interlayer insulating layer 12 is selectively etched using photolithographic technology. As a result, contact holes 12a, 12b, 12c, 12d, 12f, 12e and 12g are formed. Further, mask layers are formed so as to cover the contact holes 12a, 12c, 12d and 12f. A p-type impurity such as boron (B) or BF2 is implanted into the surface of the n-type epitaxial layer 4 at about $1.0 \times 10^{15}$ to $3.0 \times 10^{15}/cm^2$ through the contact holes 12b, 12e and 12g. Thereafter, the so-processed surface is heat-treated at a temperature of about 950° C. As a result, p-type diffusion layers 11a, 11b and 11c are respectively formed. Referring now to FIG. 12, an AlSi layer 13 ranging in thickness from about 5000 Å to 10000 Å is formed on the interlayer insulating layer 12 and within the contact holes 12a through 12g by sputtering process. The AlSi layer 13 is patterned through the above steps, the semiconductor device shown in FIG. 1 is formed.

According to the method of manufacturing the semiconductor device according to the present embodiment, as described above, the n-type buried diffusion layers 2 and 2a can be simultaneously formed. This is because the withstand voltage between the collector region of the pnp bipolar transistor and the n-type buried diffusion layer 2a is ensured. It is therefore possible to reduce the manufacturing cost. Further, the p-type diffusion layer 16 can be made up of one layer that extends from the surface of the n-type epitaxial layer 4 to the surface of the p-type silicon substrate 1. Thus, the manufacturing cost can be reduced as compared with the conventional example.

[Second Embodiment]

Figure 13:
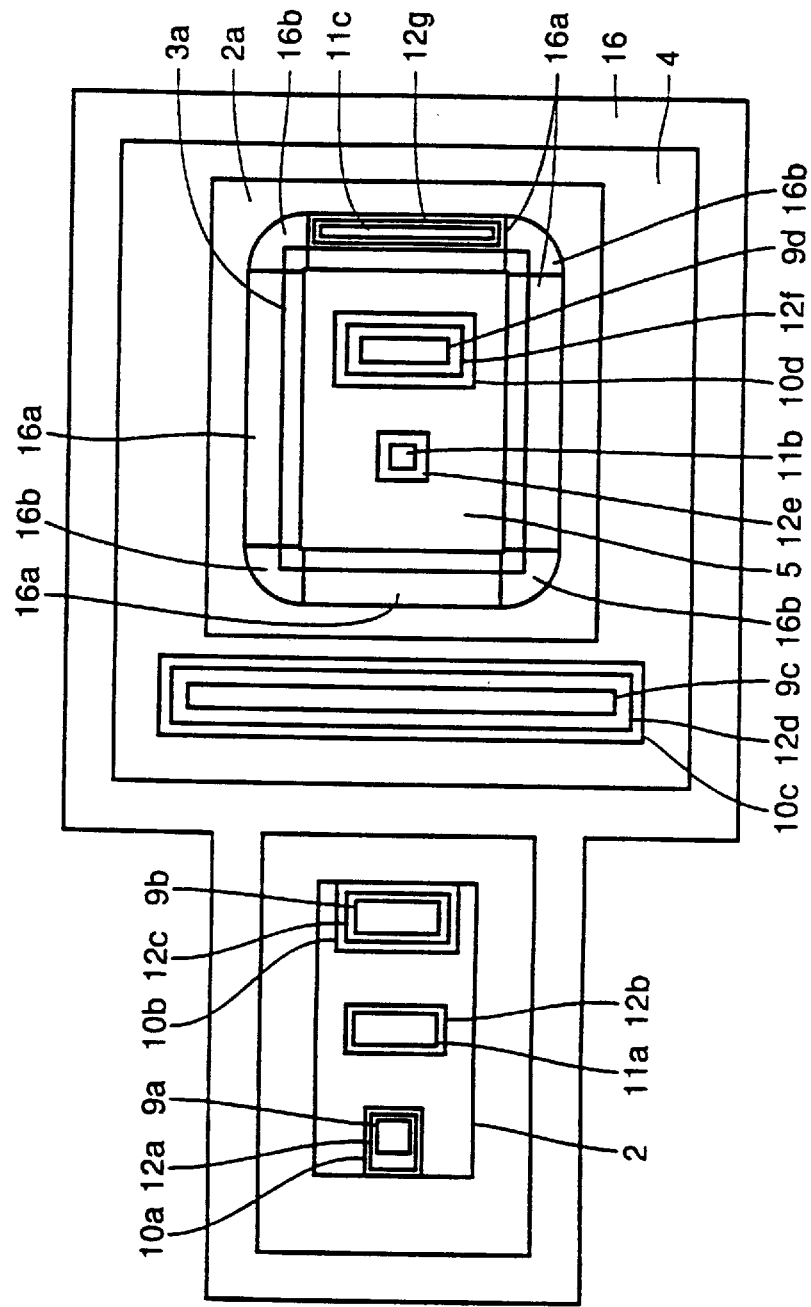
FIG. 13 is a plan view showing a semiconductor device having a vertical pnp bipolar transistor, according to a second embodiment of the present invention.

A second embodiment of the present invention will now be described with reference to FIGS. 13 and 14. FIG. 13 is a plan view showing a semiconductor device according to the second embodiment of the present invention.

Referring first to FIG. 13, p-type low-concentration regions 16b are provided at corners of a p-type diffusion layer 16a in the semiconductor device having a vertical pnp bipolar transistor, according to the present embodiment. Thus, a p-type impurity of each corner in a collector region is reduced in concentration. It is therefore possible to effectively restrain an electric field from concentrating at each lower-end corner in the collector region.

By forming side ends of a p-type buried diffusion layer 3a so as to overlap only with regions excluding outer side ends of the p-type diffusion layer 16a in a manner similar to the first embodiment, a withstand voltage between the collector region and its peripheral region can be further improved as compared with the first embodiment.

Figure 14:
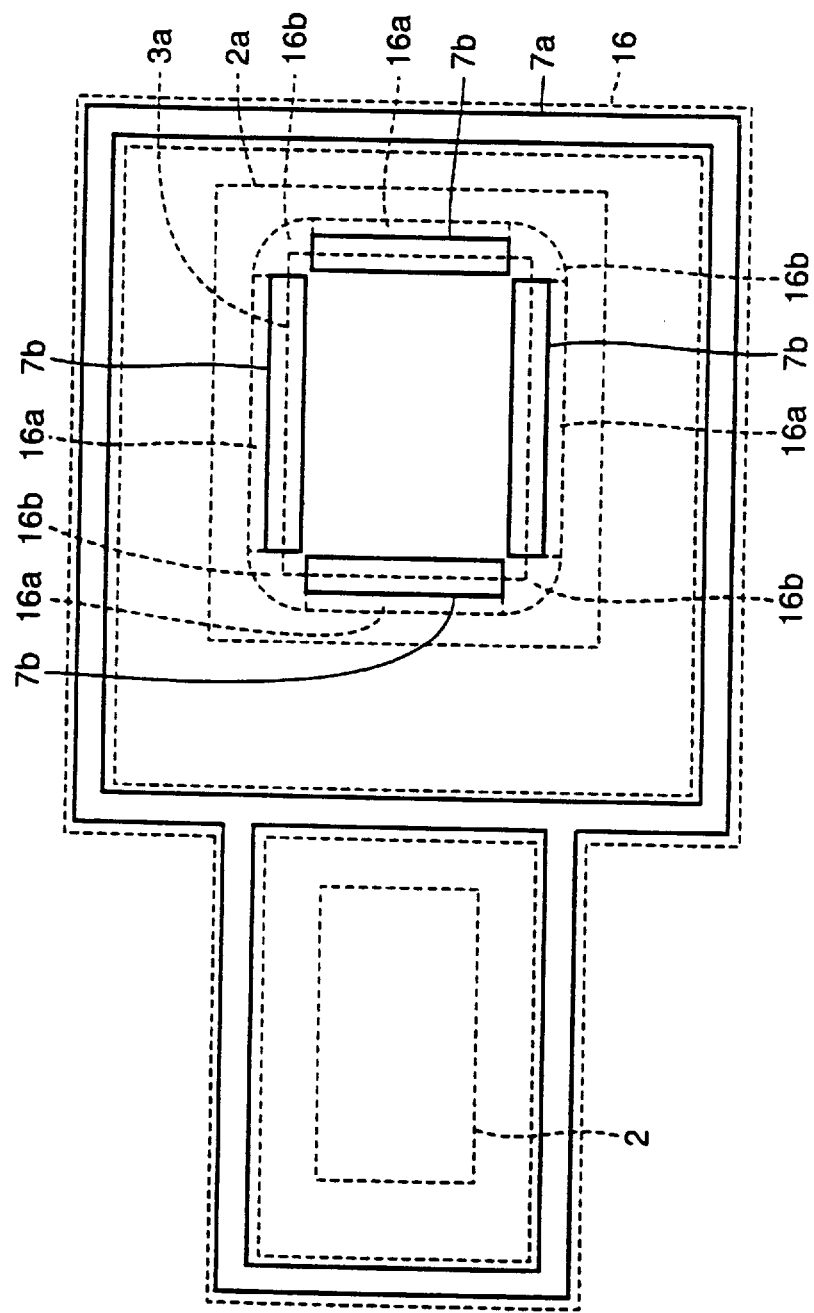
FIG. 14 is a plan view illustrating mask patterns for forming p-type diffusion layers for element isolation and p-type diffusion layers serving as a part of a collector region of the vertical pnp bipolar transistor both of which are shown in FIG. 13.

FIG. 14 is a plan view showing mask patterns for forming the p-type diffusion layers 16 and 16a and the low-concentration regions 16b. In the first embodiment, the opening 7b for forming the p-type diffusion layer 16a was shaped in ring form as shown in FIG. 9. In the present embodiment, however, as shown in FIG. 14, openings are not provided at portions corresponding to the corners of the opening 7b shown in FIG. 9.

When the p-type diffusion layer 16a is formed, a p-type impurity is introduced into each opening 7b of FIG. 14 and is diffused to form the tubular shaped p-type diffusion layer 16a. Thus, the low-concentration regions 16b are formed in the corners of the p-type diffusion layer 16a. It is therefore possible to improve a withstand voltage between the collector region of the pnp bipolar transistor and its peripheral region.

Even if the position where each of the opening 7b is formed, is slightly displaced, the low-concentration regions 16b can be reliably formed by shaping the openings 7b in the form of the patterns shown in FIG. 14. Therefore, each opening 7b can be easily formed. The other part of the semiconductor device shown in FIG. 13 is formed through steps similar to those employed in the first embodiment.

[Third Embodiment]

Figure 15:
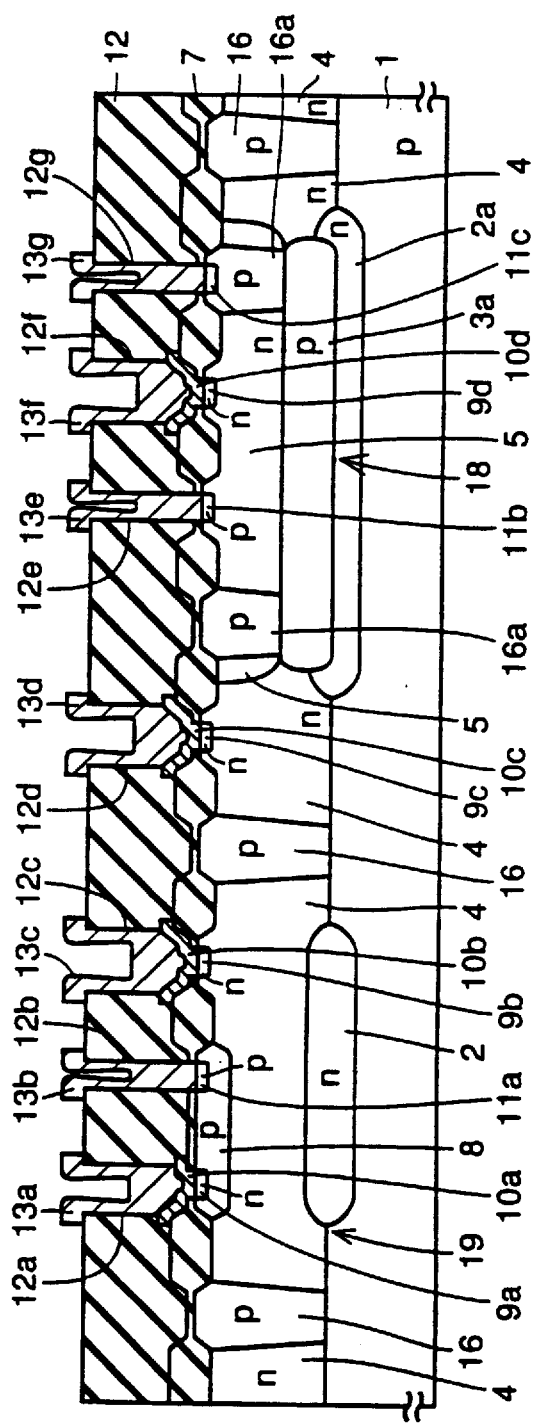
FIG. 15 is a cross-sectional view showing a semiconductor device having a vertical pnp bipolar transistor, according to a third embodiment of the present invention.
Figure 16:
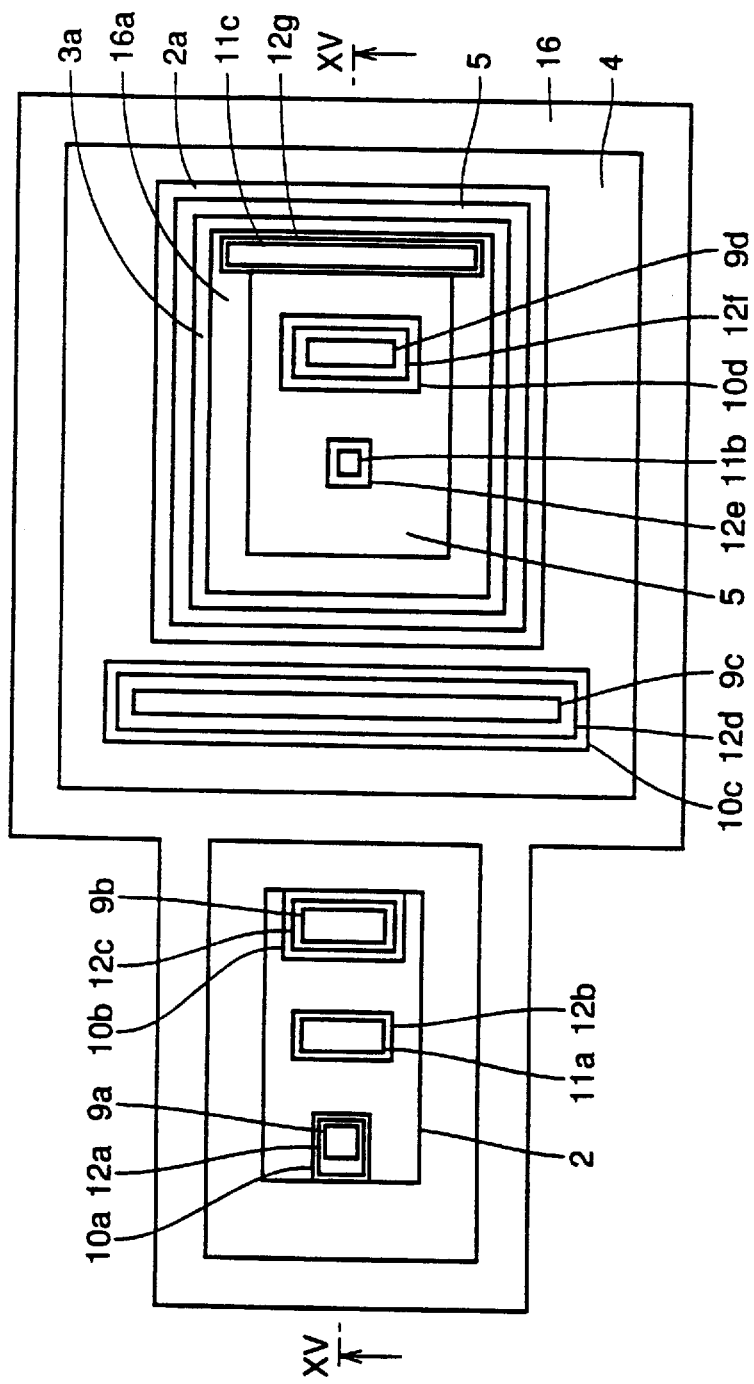
FIG. 16 is a plan view depicting the semiconductor device shown in FIG. 15.

A third embodiment of the present invention will now be described with reference to FIGS. 15 and 16. FIG. 15 is a cross-sectional view showing a semiconductor device having a vertical pnp bipolar transistor, according to the third embodiment of the present invention. FIG. 16 is a plan view showing the semiconductor device shown in FIG. 15. Incidentally, a cross-section taken along line 15—15 in FIG. 16 is shown in FIG. 15.

Referring to FIGS. 15 and 16, in the present embodiment, a plane width of an n-type diffusion layer 5, which serves as a base region of a vertical pnp bipolar transistor 18, is increased as compared with the first embodiment. A p-type diffusion layer 16a is formed so as to reach a p-type buried diffusion layer 3a through the n-type diffusion layer 5. At this time, the concentration of an n-type impurity contained in the n-type diffusion layer 5 is set so as to become higher than that of an n-type impurity contained in an n-type epitaxial layer 4. Therefore, even when a p-type diffusion layer 16 and the p-type diffusion layer 16a are formed in the same step, a diffusion depth of the p-type diffusion layer 16 can be made greater than that of the p-type diffusion layer 16a. Thus, the p-type diffusion layers 16 and 16a can be formed in the same step in such a manner that a lower end of the p-type diffusion layer 16a is overlapped only with an upper end of the p-type buried diffusion layer 3a and a lower end of the p-type diffusion layer 16 reaches a main surface of a p-type silicon substrate 1.

Since the lower end of the p-type diffusion layer 16a can be prevented from reaching the bottom of the p-type buried diffusion layer 3a, a p-type impurity contained in each outer lower-end corner in a collector region can be reduced in concentration as compared with the conventional example. As a result, a withstand voltage between the collector region and its peripheral region (particularly n-type buried diffusion layer 2a) can be improved as compared with the conventional example and the withstand voltage between the collector region and its peripheral region can be controlled by the concentration of a p-type impurity contained in the p-type buried diffusion layer 3a, thereby making it possible to easily ensure the withstand voltage.

Regarding a method of manufacturing the semiconductor device having the above structure, according to the present embodiment, the plane width of the n-type diffusion layer 5 is formed so as to become greater than that employed in the first embodiment. Further, the p-type diffusion layer 16a may be formed so as to extend through the n-type diffusion layer 5. Others are identical to those described in the first embodiment. Thus, the alignment of the p-type diffusion layer 16a with the p-type buried diffusion layer 3a can be easily performed by forming the side ends of the n-type diffusion layer 5 so as to extend up to the outside of the p-type diffusion layer 16a.

[Fourth Embodiment]

Figure 17:
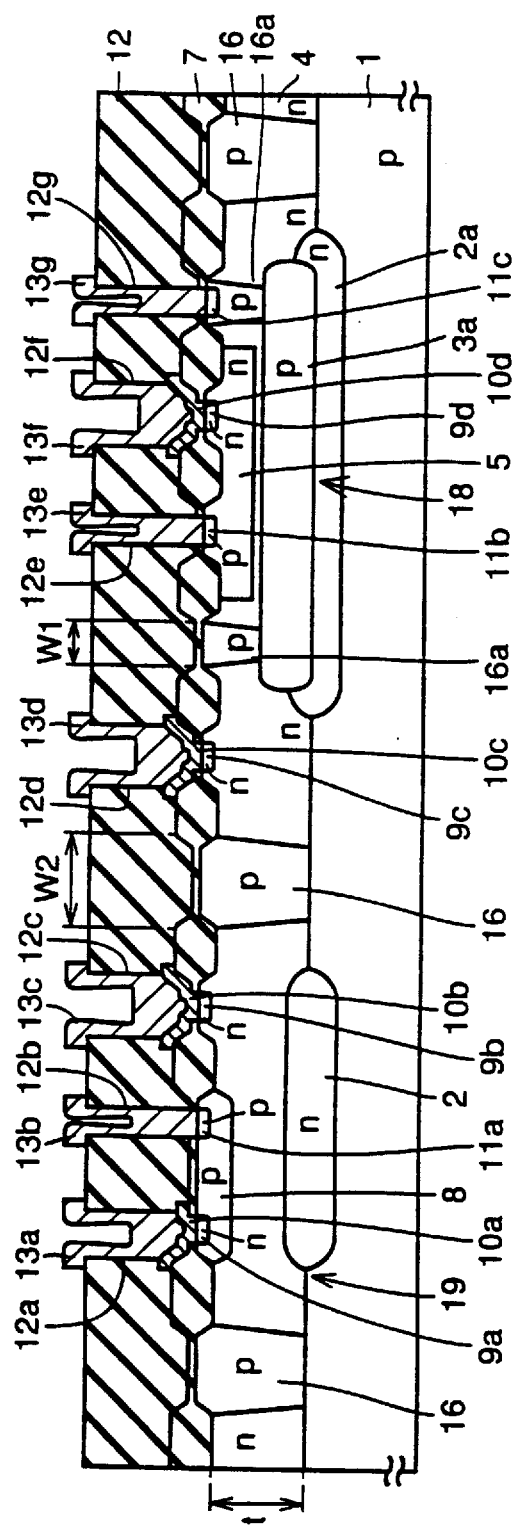
FIG. 17 is a cross-sectional view illustrating a semiconductor device having a vertical pnp bipolar transistor, according to a fourth embodiment of the present invention.
Figure 18:
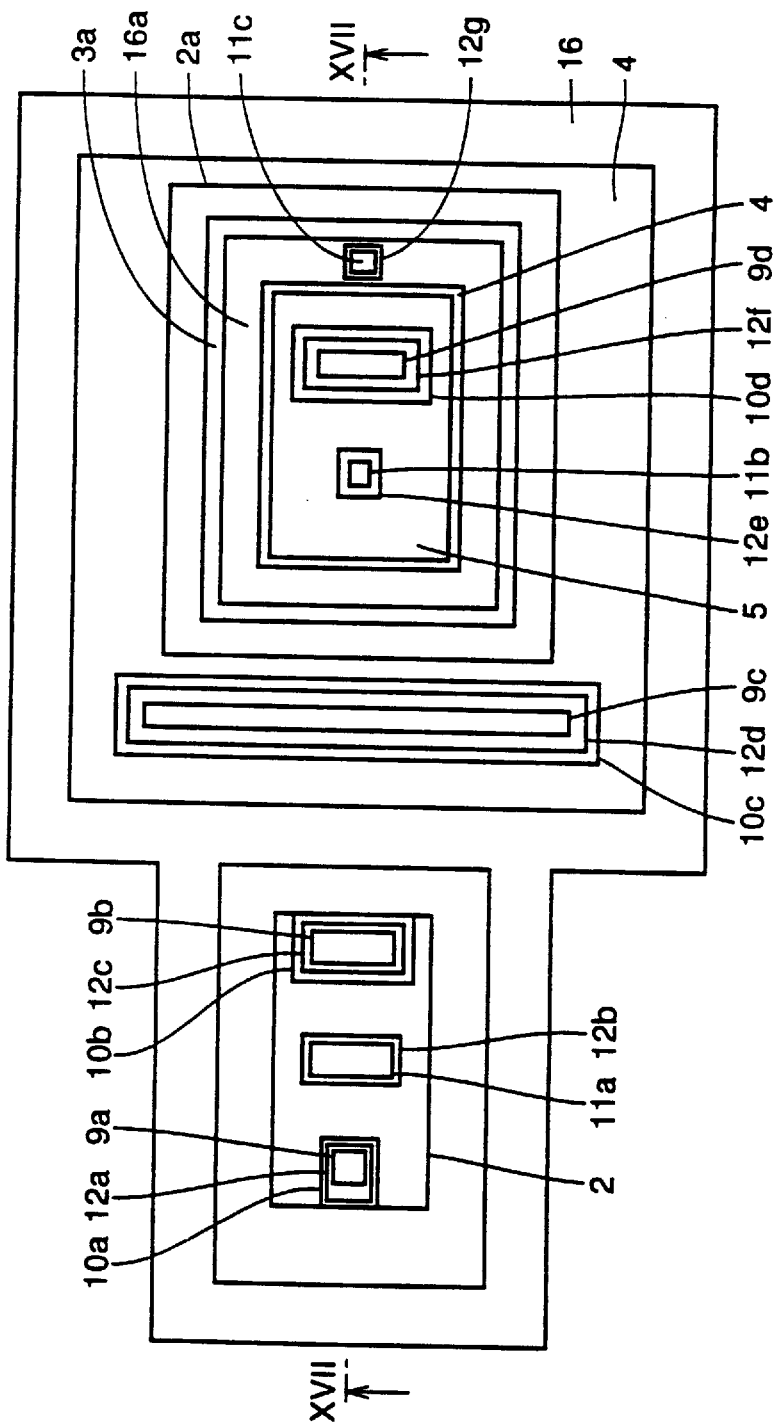
FIG. 18 is a plan view depicting the semiconductor device shown in FIG. 17.

A fourth embodiment of the present invention will now be described with reference to FIGS. 17 and 18. FIG. 17 is a cross-sectional view showing a semiconductor device having a vertical pnp bipolar transistor, according to the fourth embodiment of the present invention. FIG. 18 is a plan view illustrating the semiconductor device shown in FIG. 17. Incidentally, a cross-section taken along line XVII—XVII in FIG. 18 is shown in FIG. 17.

Referring to FIGS. 17 and 18, a plane width W2 of a p-type diffusion layer 16 is set so as to become more than or equal to a thickness t of an n-type epitaxial layer 4 in the present embodiment. Further, a plane width W1 of a p-type diffusion layer 16a is set so as to become smaller than the thickness t of the n-type epitaxial layer 4.

Thus, when the p-type diffusion layer 16 and the p-type diffusion layer 16a are formed in the same step, the p-type diffusion layer 16 can be formed so as to reach the surface of a p-type silicon substrate 1, while a lower end of the p-type diffusion layer 16a can be formed so as to overlap only with an upper end of a p-type buried diffusion layer 3a. Therefore, the concentration of a p-type impurity contained in each outer lower-end corner in a collector region of the pnp bipolar transistor can be reduced as compared with the conventional example in a manner similar to the aforementioned embodiments. As a result, a withstand voltage between the collector region and its peripheral region can be improved as compared with the conventional example.

Further, an n-type diffusion layer 5 can be formed without making contact with the p-type diffusion layer 16a by reducing the plane width W1 of the p-type diffusion layer 16a as shown in FIG. 17. Thus, a base/collector withstand voltage of the pnp bipolar transistor can also be improved.

Further, the p-type diffusion layer 16a can be easily aligned with the p-type buried diffusion layer 3a even in the case of the present embodiment in a manner similar to the third embodiment. Further, a withstand voltage between the collector region of the pnp bipolar transistor and an n-type buried diffusion layer 2a can also be controlled by the concentration of a p-type impurity contained in the p-type buried diffusion layer 3a. A method of manufacturing the semiconductor device is identical to that shown in the first embodiment except that the opening width of the opening 7a is adjusted so as to become larger than that of the opening 7b.

[Fifth Embodiment]

A fifth embodiment of the present invention will now be described with reference to FIGS. 19 through 32. FIGS. 19 through 22 are respectively cross-sectional views showing first through fourth steps of a process for manufacturing a semiconductor device having a vertical pnp bipolar transistor, according to the fifth embodiment of the present invention.

Figure 19:
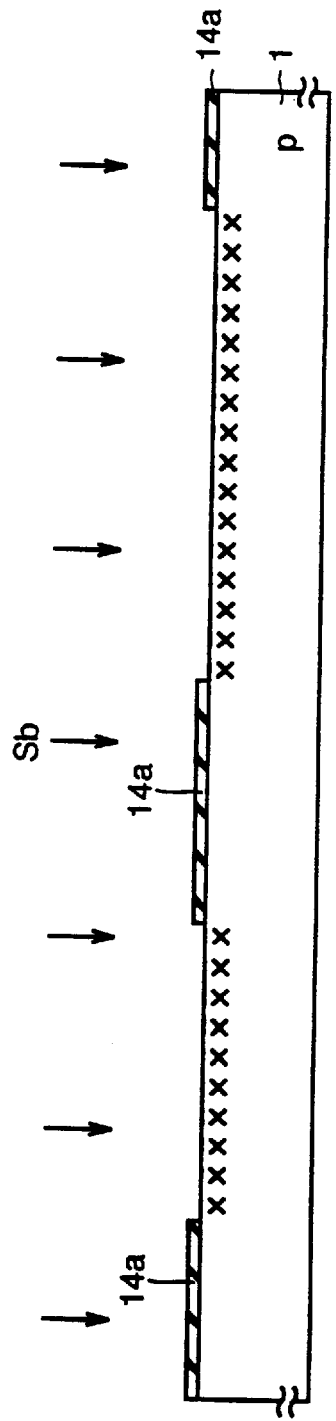
FIGS. 19 through 22 are respectively cross-sectional views showing first through fourth steps of a process for manufacturing a semiconductor device having a vertical pnp bipolar transistor, according to a fifth embodiment of the present invention.
Figure 20:
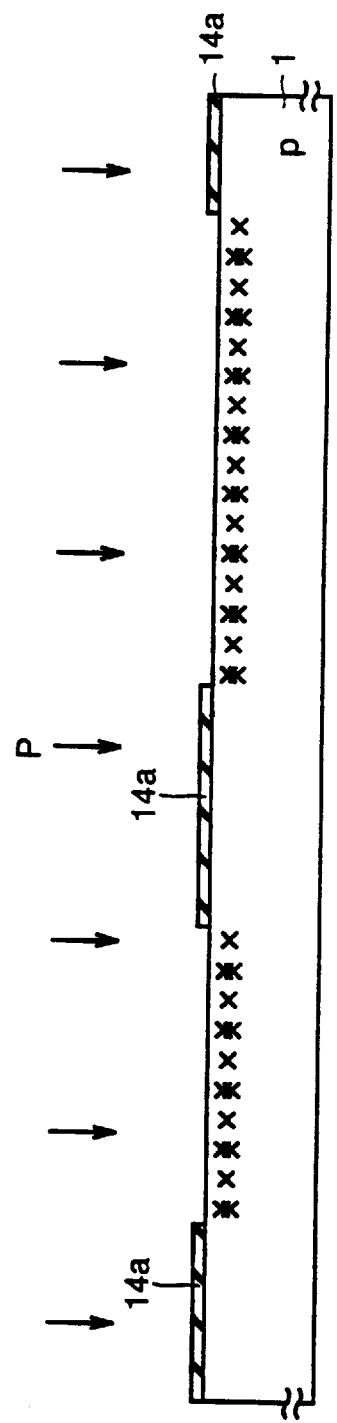

Referring now to FIG. 19, a silicon oxide film 14a ranging in thickness from about 5000 Å to 1000 Å is formed on a main surface of a p-type silicon substrate 1. Further, the silicon oxide film 14a is selectively etched using photolithographic technology. As a result, the main surface of the p-type silicon substrate 1 is selectively exposed. Thereafter, antimony (Sb) is implanted into the exposed main surface of the p-type silicon substrate 1. Next, as shown in FIG. 20, the silicon oxide film 14a is used as a mask again and phosphorus (P) is implanted into the main surface of the p-type silicon substrate 1. At this time, the amount of implantation of antimony (Sb) into the main surface preferably increases as compared with the amount of implantation of phosphorus (P) into the main surface.

Figure 21:
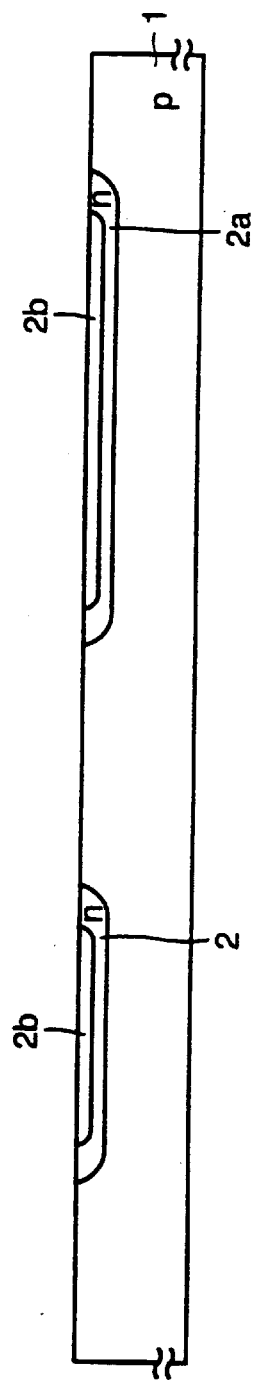

Thereafter, predetermined heat treatment is effected on the so-processed p-type silicon substrate 1 so that n-type diffusion layers 2, 2a and 2b are respectively formed as shown in FIG. 21. Described more specifically, the n-type diffusion layers 2b, which are relatively high in concentration, are respectively formed within the n-type diffusion layers 2a and 2a which are relatively low in concentration. The n-type diffusion layers are formed in such a two-layer structure because diffusion coefficients of antimony (Sb) and phosphorus (P) are different from each other. Thus, since the diffusion coefficient of phosphorus (P) is larger than that of antimony (Sb) when the same heat treatment is effected on the p-type silicon substrate 1, the phosphorus (p) is diffused into a deep portion of the p-type silicon substrate 1. As a result, the n-type diffusion layers 2 and 2a each having an n-type impurity relatively low in concentration, are respectively formed so as to surround the n-type diffusion layers 2b each having an n-type impurity relatively high in concentration.

Next, a silicon oxide film (not shown) ranging in thickness from 1000 Å to 2000 Å, which is patterned so as to expose the surface of the n-type diffusion layer 2b formed within the n-type diffusion layer 2a, is formed on the main surface of the p-type silicon substrate 1 by a method similar to that employed in the first embodiment. Further, the silicon oxide film is used as a mask and a p-type impurity such as boron (B) is implanted into the main surface of the p-type silicon substrate 1. A p-type diffusion layer (not shown) is formed at the surface of the n-type diffusion layer 2a by effecting heat treatment on the main surface of the p-type silicon substrate 1. Thereafter, the silicon oxide film is removed.

Figure 22:
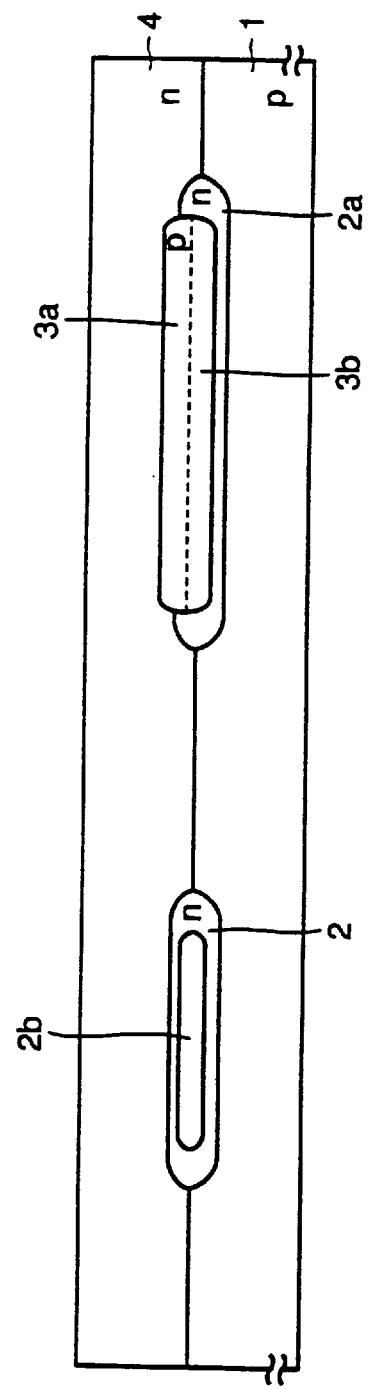

Further, an n-type epitaxial layer 4 having a thickness of 3.0 μm or less is formed on the main surface of the p-type silicon substrate 1 in accordance with the same method as that employed in the first embodiment. Thus, n-type buried diffusion layers 2 and 2a and a p-type buried diffusion layer 3a are formed as illustrated in FIG. 22.

At this time, a bottom region 3b of the p-type buried diffusion layer 3a is formed so as to cancel its corresponding n-type diffusion layer 2b formed at the surface of the n-type buried diffusion layer 2a. Therefore, the concentration of a p-type impurity contained in the bottom region 3b is relatively reduced as compared with other region within the p-type buried diffusion layer 3a. Thus, a depletion layer can expand into both the n-type buried diffusion layer 2a and the p-type buried diffusion layer 3a. As a result, a withstand voltage between a collector region of the pnp bipolar transistor and its peripheral region can be improved.

The semiconductor device having the vertical pnp bipolar transistor, according to the present embodiment, is formed through the same steps as those employed in any of the first through fourth embodiments subsequently to the above steps. Thus, the withstand voltage between the collector region of the pnp bipolar transistor and its peripheral region can be further improved as compared with the first through fourth embodiments.

A first modification of the method of manufacturing the semiconductor device according to the present embodiment will now be described with reference to FIGS. 23 through 27. FIGS. 23 through 27 are respectively cross-sectional views showing first through fifth steps of a process for manufacturing a semiconductor device according to the first modification.

Figure 23:
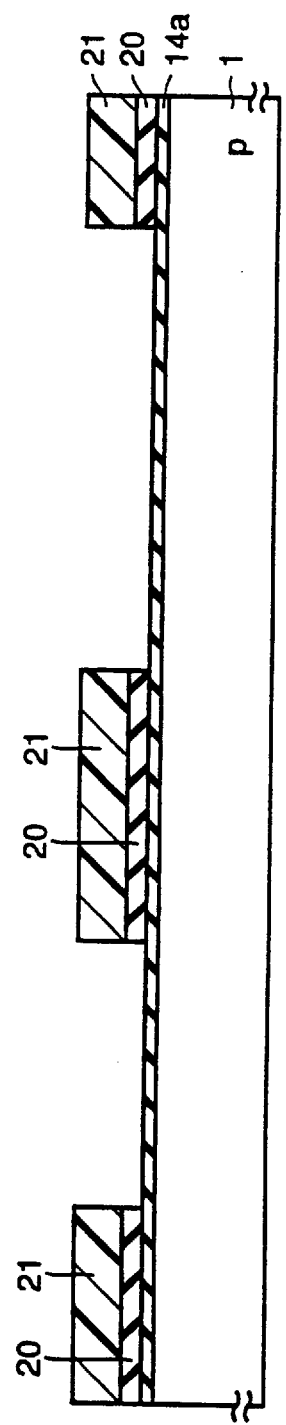
FIGS. 23 through 27 are respectively cross-sectional views showing first through fifth steps of a first modification of the method of manufacturing the semiconductor device having the vertical pnp bipolar transistor, according to the fifth embodiment of the present invention.
Figure 24:
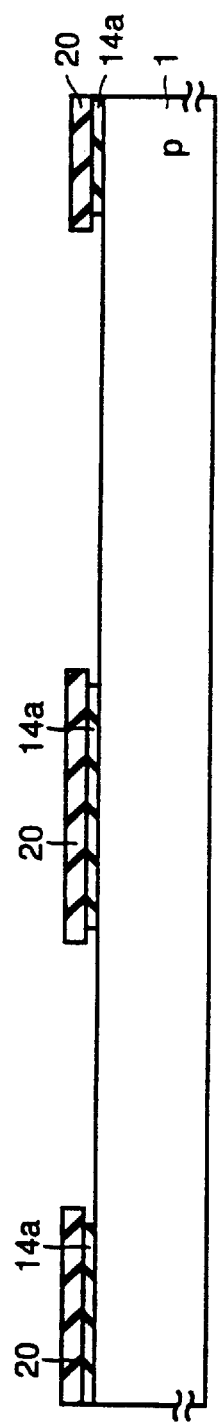

Referring first to FIG. 23, a silicon oxide film 14a, a silicon nitride film 20 and a resist 21 are successively formed on a main surface of a p-type silicon substrate 1. Further, the resist 21 is patterned in a predetermined shape. The resist 21 is used as a mask and only the silicon nitride film 20 is etched by heat phosphoric acid. Thereafter, the silicon oxide film 14a is etched by wet etching. Subsequently to the above etching, the resist 21 is removed. Thus, ends of the silicon oxide film 14a are backed up from their corresponding ends of the silicon nitride film 20 as shown in FIG. 24.

Figure 25:
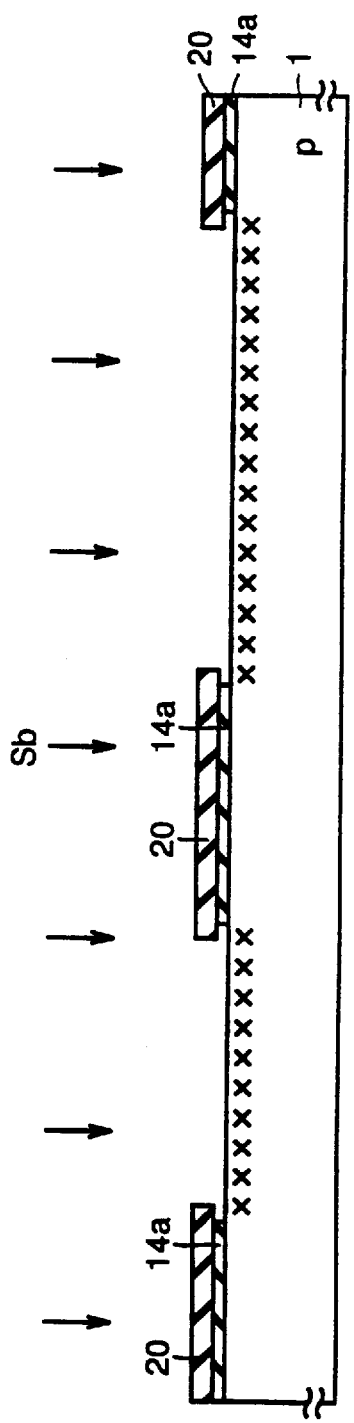

Referring next to FIG. 25, the silicon nitride film 20 is used as a mask and antimony (Sb) is implanted into the main surface of the p-type silicon substrate 1. Thereafter, the silicon nitride film 20 is removed by heat phosphoric acid.

Figure 26:
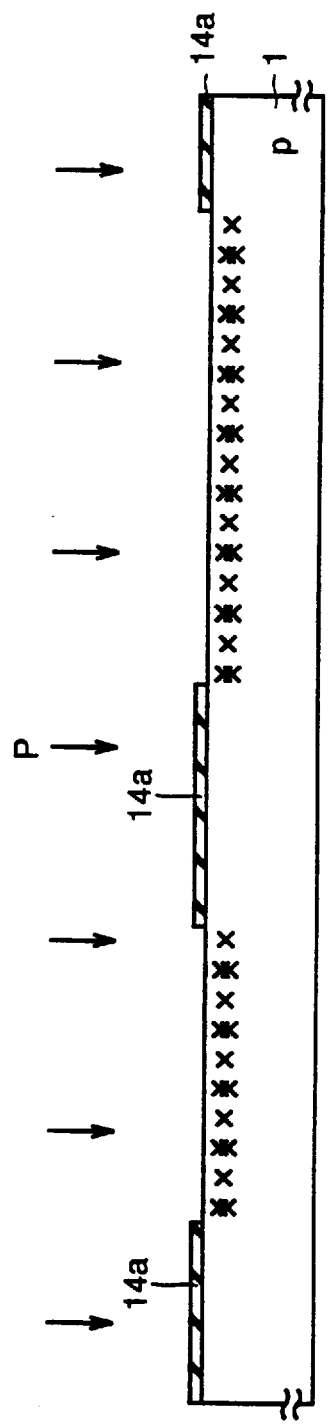
Figure 27:
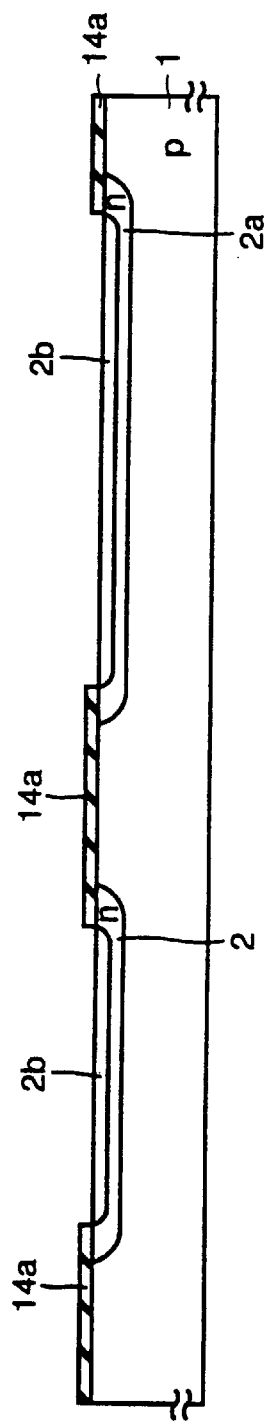

Referring next to FIG. 26, the silicon oxide film 14a is used as a mask and phosphorus (P) is implanted into the main surface of the p-type silicon substrate 1. Even in this case, the amount of implantation of antimony (Sb) into the main surface is preferably set to become greater than the amount of implantation of phosphorus (P) into the main surface. Thereafter, as shown in FIG. 27, n-type diffusion layers 2b each relatively high in concentration are respectively formed within n-type diffusion layers 2 and 2a each relatively low in concentration by effecting heat treatment similar to that employed in the fifth embodiment on the main surface of the p-type silicon substrate 1. According to the present modification, since the ends of the silicon oxide film 14a used as the mask upon implanting phosphorus (P) into the main surface are backed up from their corresponding ends of the silicon nitride film 20 used as the mask upon implanting antimony (Sb) into the main surface, the n-type diffusion layers 2b impregnated with antimony can be reliably formed within the n-type diffusion layers 2 and 2a impregnated with phosphorus.

The semiconductor device according to the present modification is formed through the same steps as those employed in the fifth embodiment subsequently to above steps.

A second modification of the method of manufacturing the semiconductor device according to the fifth embodiment will now be described with reference to FIGS. 28 through 32. FIGS. 28 through 32 are respectively cross-sectional views showing first through fifth steps of a process of manufacturing the semiconductor device, which are employed in the second modification.

Figure 28:
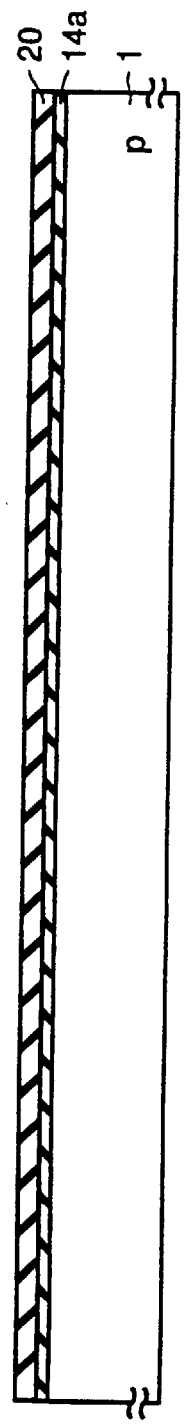
FIGS. 28 through 32 are respectively cross-sectional views illustrating first through fifth steps of a second modification of the method of manufacturing the semiconductor device having the vertical pnp bipolar transistor, according to the fifth embodiment of the present invention.
Figure 29:
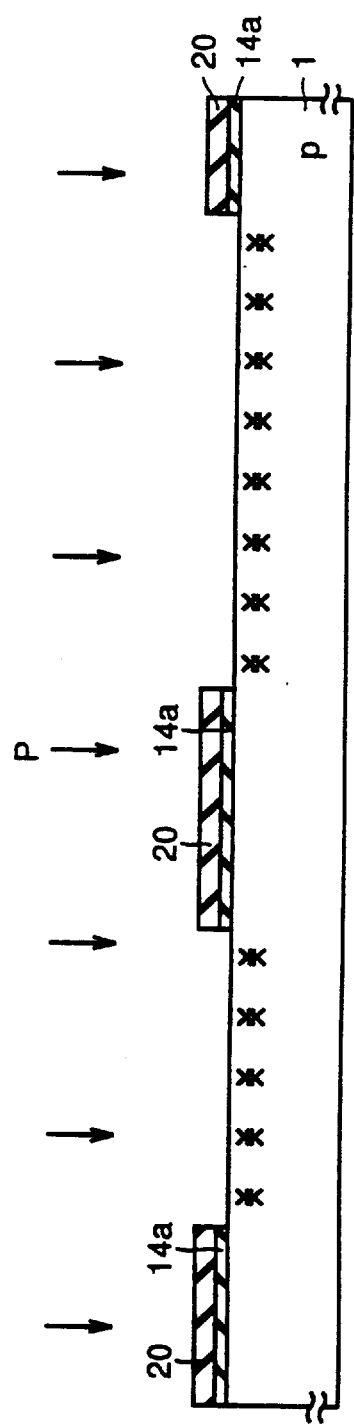

Referring now to FIG. 28, a silicon oxide film 14a and a silicon nitride film 20 are successively formed on a main surface of a p-type silicon substrate 1. Next, the silicon nitride film 20 and the silicon oxide film 14a are selectively etched using photolithographic technology. Thus, the main surface of the p-type silicon substrate 1 is selectively exposed. Further, a stacked structure formed of stacking the silicon nitride film 20 and the silicon oxide film 14a is used as a mask and phosphorus (P) is implanted into the main surface of the p-type silicon substrate 1 as shown in FIG. 29.

Figure 30:
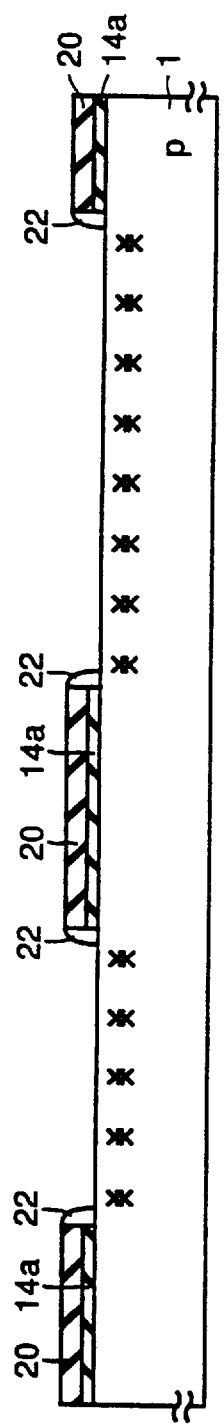

Next, a silicon oxide film is deposited so as to cover the main surface of the p-type silicon substrate 1 and the silicon nitride film 20 by CVD process or the like. Anisotropic etching is effected on the silicon oxide film by using gas high in selection ratio with respect to the silicon nitride film 20. As a result, a side wall insulating film 22 is formed as shown in FIG. 30.

Figure 31:
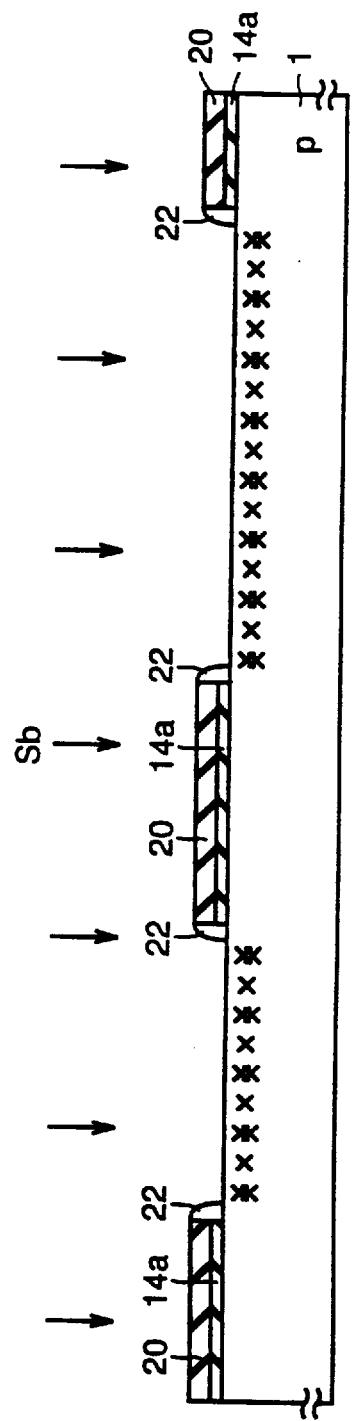

Referring next to FIG. 31, the silicon nitride film 20 and the side wall insulating film 22 are used as masks and antimony (Sb) is implanted into the main surface of the p-type silicon substrate 1.

Figure 32:
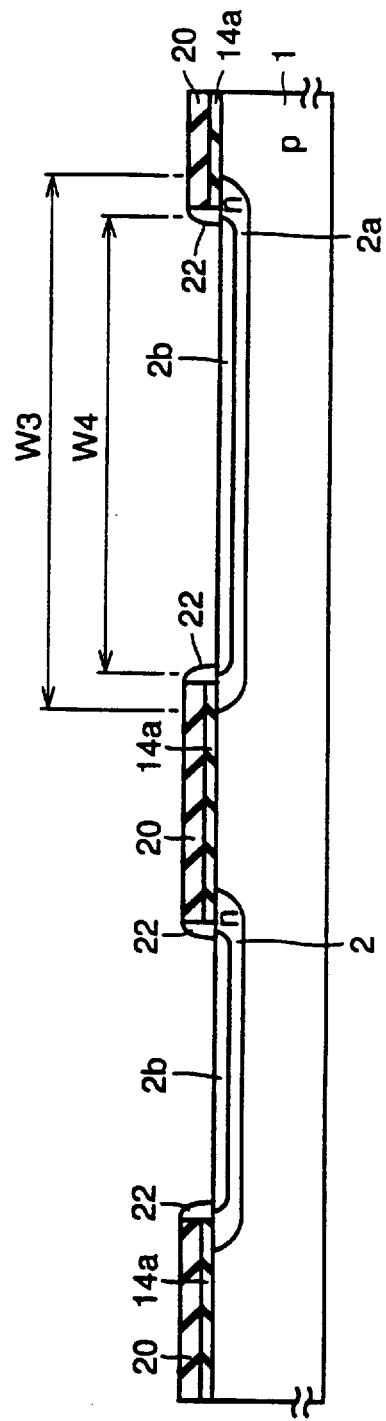

Thereafter, n-type diffusion layers 2, 2a and 2b are respectively formed as shown in FIG. 32 by effecting heat treatment on the so-processed main surface of the p-type silicon substrate 1. According to the present modification, it is unnecessary to use wet etching as in the case of the first modification. Thus, variations in a plane width W3 of the n-type buried diffusion layer 2a and a plane width W4 of each n-type diffusion layer 2b can be reduced as compared with the first modification. Therefore, the device can be reduced in size.

The semiconductor device according to the present modification is formed through steps similar to those employed in the fifth embodiment subsequently to the above steps.

[Sixth Embodiment]

Figure 33:
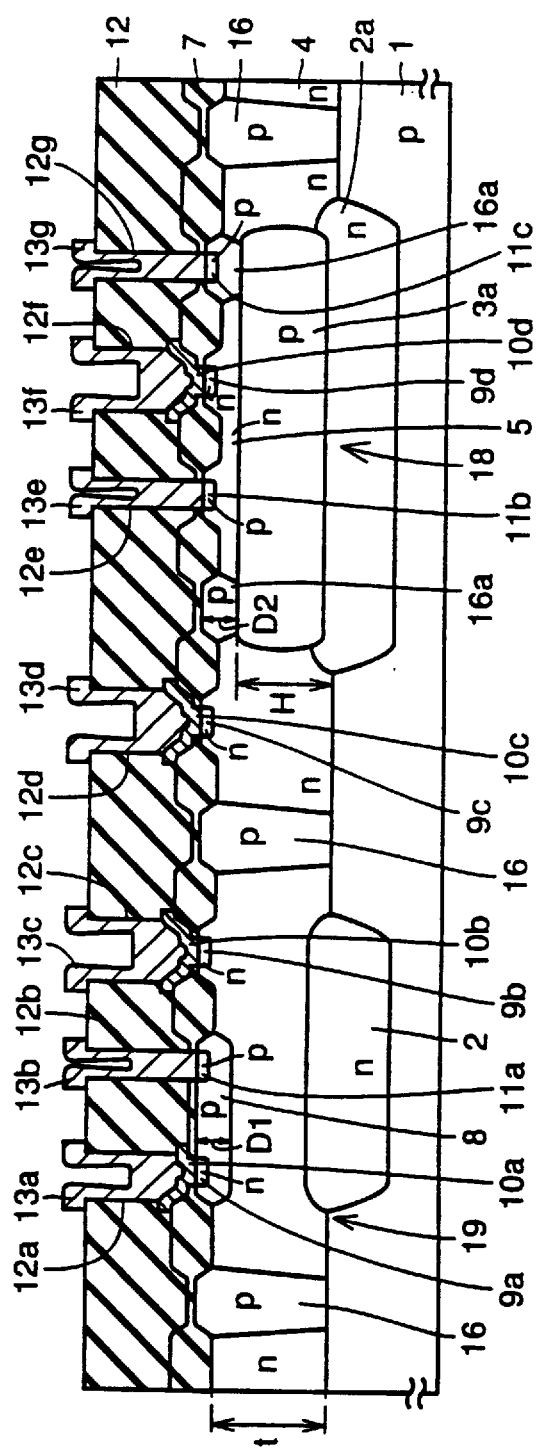
FIG. 33 is a cross-sectional view showing a semiconductor device having a vertical pnp bipolar transistor, according to a sixth embodiment of the present invention.

A sixth embodiment of the present invention will now be described with reference to FIGS. 33 through 36. FIG. 33 is a cross-sectional view showing a semiconductor device having a vertical pnp bipolar transistor, according to the sixth embodiment of the present invention.

First of all, the structure of the semiconductor device according to the present embodiment will be described with reference to FIG. 33. Referring to FIG. 33, a height H of an upper surface of a p-type buried diffusion layer 3a from an interface between a p-type silicon substrate 1 and an n-type epitaxial layer 4, is set so as to become more than or equal to two-third the thickness t of the epitaxial layer 4. Thus, a p-type diffusion layer 16a and a p-type diffusion layer 8 can be formed in the same step. As a result, a diffusion depth D1 of the p-type diffusion layer 8 is equal to a diffusion depth D2 of the p-type diffusion layer 16a. Others are substantially identical in structure to those employed in the semiconductor device according to the first embodiment shown in FIG. 1.

The p-type buried diffusion layer 3a is expanded by increasing the height of the upper surface of the p-type buried diffusion layer 3a as described above. Therefore, a collector resistance of the pnp bipolar transistor 18 can be reduced. Correspondingly, the concentration of the p-type buried diffusion layer 3a is also lowered. As a result, a withstand voltage between a collector region of the pnp bipolar transistor 18 and its peripheral region can be increased. Further, an effective base width (corresponding to a diffusion depth of an n-type diffusion layer 5) of the vertical pnp bipolar transistor can be reduced. Consequently, a current amplification factor of the pnp bipolar transistor can be increased.

Figure 34:
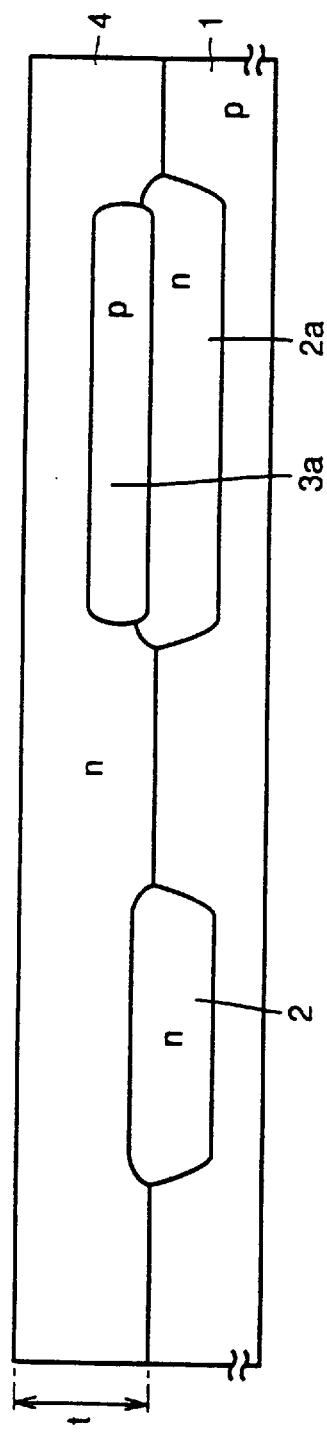
FIGS. 34, through 36 are respectively cross-sectional views depicting characteristic first through third steps of a process for manufacturing the semiconductor device shown in FIG. 33.
Figure 35:
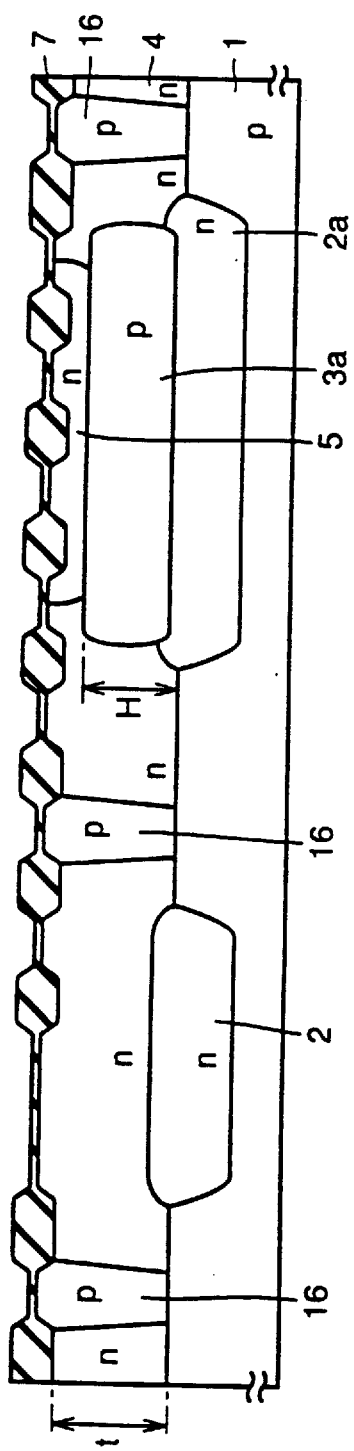
Figure 36:
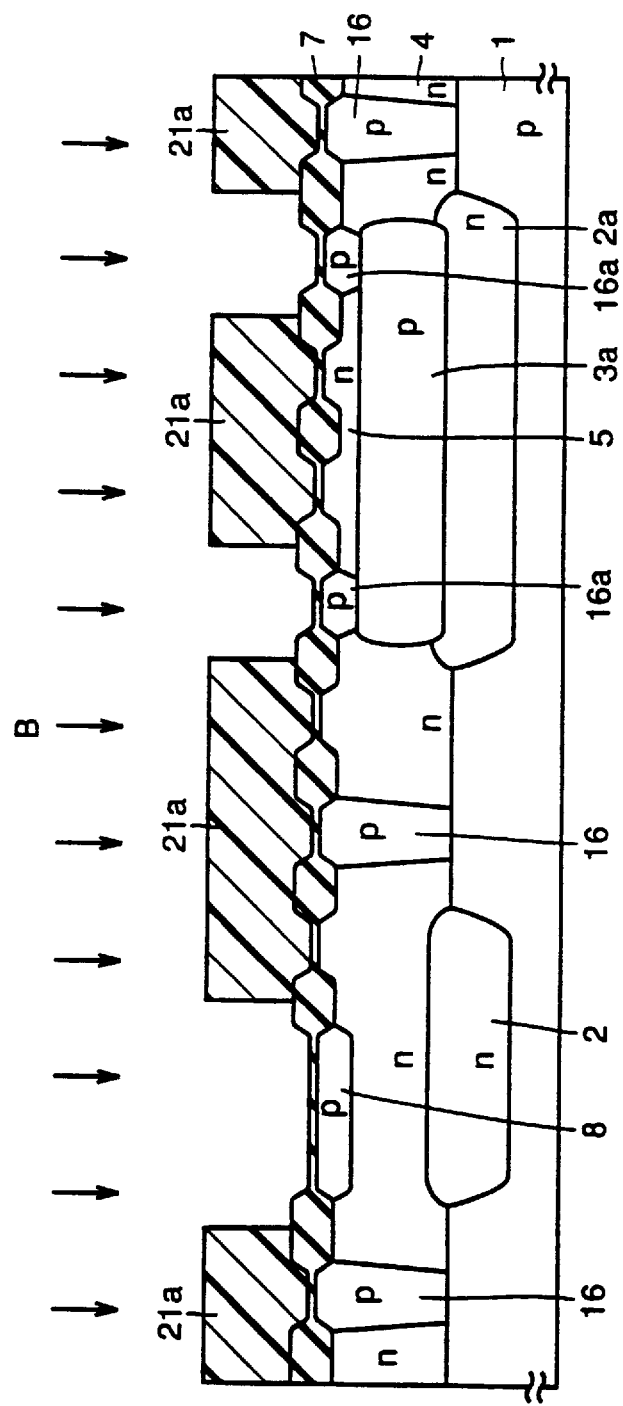

A method of manufacturing the semiconductor device according to the present embodiment will now be described with reference to FIGS. 34 through 36. FIGS. 34 through 36 are respectively cross-sectional views showing first through third steps of a process for manufacturing the semiconductor device according to the present embodiment.

Referring first to FIG. 34, respective components up to an n-type epitaxial layer 4 are formed through steps similar to those employed in the first embodiment. At this time, the amount of implantation of boron (B) used for the formation of a p-type buried diffusion layer 3a is about $4.0 \times 10^{14}$ to $7.0 \times 10^{14}/cm^2$.

Referring now to FIG. 35, an n-type diffusion layer 5 and an isolation oxide film 7 are formed in accordance with a method similar to that employed in the first embodiment. The surface of the n-type epitaxial layer 4 is selectively exposed in accordance with the method similar to that employed in the first embodiment. Boron (B) is deposited on the exposed surface of the n-type epitaxial layer 4, followed by heat treatment at a temperature of 1100° C. or higher. Thus, a p-type diffusion layer 16 is formed so as to reach a p-type silicon substrate 1. Further, a height H of an upper surface of the p-type buried diffusion layer 3a from an interface between the p-type silicon substrate 1 and the n-type epitaxial layer 4, is set so as to become more than or equal to two-third the thickness t of the n-type epitaxial layer 4.

Referring next to FIG. 36, a resist pattern 21a patterned in a predetermined shape is formed on the isolation oxide film 7. The resist pattern 21a is used as a mask and boron (B) is implanted into the surface of the n-type epitaxial layer 4. As a result, a p-type diffusion layer 8 which serves as a base region of an npn bipolar transistor and a p-type diffusion layer 16a which serves as a part of a collector region of a pnp bipolar transistor, can be simultaneously formed. Thereafter, the resist pattern 21a is removed.

A diffusion depth of the p-type diffusion layer 16a is relatively reduced by simultaneously forming the p-type diffusion layer 8 and the p-type diffusion layer 16a as described above. Therefore, the bottom of the p-type diffusion layer 16a does not reach the bottom of the p-type buried diffusion layer 3a. As a result, the concentration of the bottom of the p-type buried diffusion layer 3a can be lowered. A contact resistance between the p-type diffusion layer 16 and the p-type silicon substrate 1 can also be reduced by forming the p-type diffusion layer 16 at a higher temperature. As a result, an element-to-element leakage current can be effectively decreased.

The semiconductor device shown in FIG. 33 is formed through steps similar to those employed in the first embodiment subsequently to the above steps.

According to this invention, as has been described above, the concentration of each outer lower end corner in a collector region can be reduced. It is therefore possible to increase a withstand voltage between the collector region and its peripheral region. According to the present invention as well, when different conductivity type bipolar transistors are formed in positions adjacent to each other, buried diffusion layers respectively included in the bipolar transistors can be formed in the same step. Further, element isolation regions for isolating between the bipolar transistors can be formed so as to extend from the surface of a semiconductor layer to the main surface of a semiconductor substrate and a part of a collector region of one of the bipolar transistors can be formed in accordance with a step identical to the step of forming the element isolation regions. It is therefore possible to reduce the manufacturing cost.

According to the present invention, as has been described above, a semiconductor device having bipolar transistors can be obtained which is capable of reducing the manufacturing cost and improving reliability.

Although the present invention has been described and illustrated in detail, it is clearly understood that the same is by way of illustration and example only and is not to be taken by way of limitation, the spirit and scope of the present invention being limited only by the terns of the appended claims.

What is claimed is:

1. A bipolar transistor comprising:
a first conductivity type semiconductor substrate having a main surface;
a second conductivity type semiconductor layer formed on the main surface of said semiconductor substrate;
a second conductivity type buried diffusion layer formed extending in both said semiconductor layer and said semiconductor substrate;
a second conductivity type base region formed in a surface of said semiconductor layer located above said buried diffusion layer;
a collector region composed of a first conductivity type first region and a first conductivity type second region, said first region surrounding side ends of said base region, extending through said semiconductor layer so as to reach said buried diffusion layer and having a tubular shaped lower end, said lower end including corners, said first region being constructed such that a concentration of a first conductivity type impurity contained in said corners of the tubular shaped lower end is lower than that of a first conductivity type impurity contained in the tubular shaped lower end adjacent to said corners and said second region overlapping with at least an inner lower end and being formed so as to have a bottom face within said buried diffusion layer; and
a first conductivity type emitter region formed in a surface of said base region, wherein a periphery of the second region is positioned more inward than that of the first region.

2. The bipolar transistor according to claim 1,
wherein said second region overlaps a lower end of said first region exclusive an outer lower end of said first region.

3. A bipolar transistor comprising:
a first conductivity type semiconductor substrate having a main surface;
a second conductivity type semiconductor layer formed on the main surface of said semiconductor substrate;
a second conductivity type buried diffusion layer formed extending in both said semiconductor layer and said semiconductor substrate;
a second conductivity type base region formed in a surface of said semiconductor layer located above said buried diffusion layer;
a collector region composed of a first conductivity type first region formed just below a bottom of said base region so as to have a bottom face within said buried diffusion layer and a first conductivity type second region extending through said base region so as to surround said base region and reach said first region; and
a first conductivity type emitter region formed in at surface of said base region.

4. The bipolar transistor according to claim 3, wherein said second region overlaps only an upper end portion of said first region.

5. The bipolar transistor according to claim 3, wherein a concentration of a second conductivity type impurity contained in said semiconductor layer is lower than that of a second conductivity type impurity contained in said base region.

6. The bipolar transistor according to claim 3, wherein a first conductivity type element isolation region is formed within said semiconductor layer so as to extend through said semiconductor layer surrounding said collector region and said buried diffusion layer and thereby reach the main surface of said semiconductor substrate, and a diffusion depth of said second region from the surface of said semiconductor layer, is shallower than that of said element isolation region from the surface of said semiconductor layer.

7. A semiconductor device having a bipolar transistor comprising:
a first conductivity type semiconductor substrate having a main surface;
a second conductivity type semiconductor layer formed on the main surface of said semiconductor substrate;
a second conductivity type buried diffusion layer formed extending in both said semiconductor layer and said semiconductor substrate;
a second conductivity type base region formed in a surface of said semiconductor layer located above said buried diffusion layer;
a collector region composed of a first conductivity type first region formed below a bottom of said base region so as to have a bottom face within buried diffusion layer and a first conductivity type second region formed within said semiconductor layer so as to surround side ends of said base region and reach said first region, said second region having a first plane width smaller than a thickness of said semiconductor layer;
a first conductivity type emitter region formed in a surface of said base region; and
a first conductivity type element isolation region formed within said semiconductor layer surrounding said collector region and said buried diffusion layer, said element isolation region having a second plane width greater than or equal to the thickness of said semiconductor layer and extending through said semiconductor layer so as to reach the main surface of said semiconductor substrate.

8. The semiconductor device according to claim 7, wherein said second region overlaps only an upper end portion of said first region.

9. The semiconductor device according to claim 7, wherein said semiconductor layer remains between said base region and said collector region.

10. A bipolar transistor comprising:

a first conductivity type semiconductor substrate having a main surface;

a second conductivity type semiconductor layer formed on the main surface of said semiconductor substrate;

a second conductivity type buried diffusion layer formed extending in both said semiconductor layer and said semiconductor substrate;

a second conductivity type base region formed in a surface of said semiconductor layer located above said buried diffusing layer;

a collector region composed of a first conductivity type first region and a tubular shaped first conductivity type second region, said first region being formed just below a bottom of said base region so as to have a bottom face within said buried diffusion layer and being constructed such that a concentration of a first conductivity type impurity contained in the bottom thereof is lower than that of a first conductivity type impurity contained in a portion other than the bottom thereof and said second region being formed so as to surround side ends of said base region and so as to extend through said semiconductor layer to reach the first region; and a first conductivity type emitter region formed in a surface of said base region, wherein a periphery of the first region of the collector is positioned more inward than that of the second region of the collector region, wherein said second region includes lower end corners, a concentration of a first conductivity type impurity contained in said lower end corners of said second region is lower than that of a first conductivity type impurity contained in portions in said second region adjacent to said lower end corners thereof.

11. A bipolar transistor comprising:

a first conductivity type semiconductor substrate having a main surface;

a second conductivity type semiconductor layer formed on the main surface of said semiconductor substrate;

a second conductivity type buried diffusion layer formed extending in both said semiconductor layer and said semiconductor substrate;

a second conductivity type base region formed in a surface of said semiconductor layer located above said buried diffusion layer;

a collector region composed of a first conductivity type first region and a tubular shared first conductivity type second region, said first region being formed just below a bottom of said base region so as to have a bottom face within said buried diffusion layer and being constructed such that a concentration of a first conductivity type impurity contained in the bottom thereof is lower than that of a first conductivity type impurity contained in a portion other than the bottom thereof and said second region being formed so as to surround side ends of said base region and so as to extend through said semiconductor layer to reach the first region; and a first conductivity type emitter region formed in a surface of said base region, wherein a periphery of the first region of the collector is positioned more inward than that of the second region of the collector region, wherein said second region has a first plane width smaller than a thickness of said semiconductor layer and overlaps only an upper end portion of said first region, and a first conductivity type element isolation region is formed within said semiconductor layer so as to surround said collector region and said buried diffusion layer and have a second plane width greater than or equal to the thickness of said semiconductor layer and so as to extend through said semiconductor layer to reach the main surface of said semiconductor substrate.

12. A bipolar transistor comprising:

a first conductivity type semiconductor substrate having a main surface;

a second conductivity type semiconductor layer formed on the main surface of said semiconductor substrate;

a second conductivity type buried diffusion layer formed extending in both said semiconductor layer and said semiconductor substrate;

a second conductivity type base region formed in a surface of said semiconductor layer located above said buried diffusion layer;

a collector region composed of a first conductivity type first region and a first conductivity type second region, said first region being formed just below a bottom of said base region so as to have a bottom face within said buried diffusion layer and a height of an upper surface of said first region extending from an interface between said semiconductor layer and said semiconductor substrate being two-third or more the thickness of said semiconductor layer and said second region being formed within said semiconductor layer so as to surround side ends of said base region and reach said first region; and a first conductivity type emitter region formed in a surface of said base region.

13. A semiconductor device having a bipolar transistor, comprising:

a first conductivity type semiconductor substrate having a main surface;

a second conductivity type semiconductor layer formed on the main surface of said semiconductor substrate;

first and second buried diffusion layers each formed extending in both said semiconductor layer and said semiconductor substrate with an interval defined therebetween and respectively containing second conductivity type impurity identical in concentration to each other;

a first conductivity type first base region formed in a surface of said semiconductor layer located above said first buried diffusion layer;

a second conductivity type first emitter region formed in a surface of said first base region;

a first conductivity type element isolation region surrounding a first collector region within said semiconductor layer around said first base region, said element isolation region extending through said semiconductor layer so as to reach said semiconductor substrate;

a second conductivity type second base region formed in a surface of said semiconductor layer located above said second buried diffusion layer;

a second collector region composed of a first conductivity type first region and a first conductivity type second region, said first region being formed just below a bottom of said second base region so as to have a bottom face within said second buried diffusion layer and a height (H) of an upper surface of said first region from an interface between said semiconductor layer and said semiconductor substrate being two-third or more the thickness of said semiconductor layer and said second region being formed within said semiconductor layer so as to surround side ends of said second base region, having a diffusion depth equal to that of said first base region and reach the first region; and a first conductivity type second emitter region formed in a surface of said second base region.

* * * * *